US009607822B2

(12) United States Patent
Buckalew et al.

(10) Patent No.: US 9,607,822 B2
(45) Date of Patent: Mar. 28, 2017

(54) PRETREATMENT METHOD FOR PHOTORESIST WAFER PROCESSING

(71) Applicant: Lam Research Corporation, Fremont, CA (US)

(72) Inventors: Bryan L. Buckalew, Tualatin, OR (US); Mark L. Rea, Tigard, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/264,262

(22) Filed: Sep. 13, 2016

(65) Prior Publication Data
US 2017/0011906 A1 Jan. 12, 2017

Related U.S. Application Data

(62) Division of application No. 14/257,744, filed on Apr. 21, 2014, now Pat. No. 9,469,912.

(51) Int. Cl.
H01L 21/00 (2006.01)
H01L 21/02 (2006.01)
(Continued)

(52) U.S. Cl.
CPC ........ *H01L 21/02068* (2013.01); *C25D 5/022* (2013.01); *C25D 5/34* (2013.01);
(Continued)

(58) Field of Classification Search
CPC ............ H01L 21/0273; H01L 21/0206; H01L 21/6723; H01L 21/02068; C25D 7/123;
(Continued)

(56) References Cited

U.S. PATENT DOCUMENTS 4,642,161 A 2/1987 Akahoshi et al.
4,902,551 A 2/1990 Nakaso et al.
(Continued)

FOREIGN PATENT DOCUMENTS

CN 1639859 A 7/2005
CN 101730929 A 6/2010
(Continued)

OTHER PUBLICATIONS

U.S. Patent Application titled, "Improved Deposit Morphology of Electroplated Copper," filed Jun. 11, 2012, U.S. Appl. No. 13/493,933.
(Continued)

*Primary Examiner* — Caleb Henry
*Assistant Examiner* — Alexander Belousov
(74) *Attorney, Agent, or Firm* — Weaver Austin Villeneuve & Sampson LLP

(57) ABSTRACT

Certain embodiments herein relate to methods and apparatus for processing a partially fabricated semiconductor substrate in a remote plasma environment. The methods may be performed in the context of wafer level packaging (WLP) processes. The methods may include exposing the substrate to a reducing plasma to remove photoresist scum and/or oxidation from an underlying seed layer. In some cases, photoresist scum is removed through a series of plasma treatments involving exposure to an oxygen-containing plasma followed by exposure to a reducing plasma. In some embodiments, an oxygen-containing plasma is further used to strip photoresist from a substrate surface after electroplating. This plasma strip may be followed by a plasma treatment involving exposure to a reducing plasma. The plasma treatments herein may involve exposure to a remote plasma within a plasma treatment module of a multi-tool electroplating apparatus.

15 Claims, 17 Drawing Sheets

(51) Int. Cl.

| | | |
|---|---|---|
| *H01J 37/32* | (2006.01) | |
| *C25D 5/48* | (2006.01) | |
| *C25D 5/02* | (2006.01) | |
| *C25D 5/34* | (2006.01) | |
| *C25D 7/12* | (2006.01) | |
| *H01L 21/027* | (2006.01) | |
| *H01L 21/67* | (2006.01) | |
| *H01L 21/768* | (2006.01) | |
| *G03F 7/42* | (2006.01) | |

(52) U.S. Cl.
CPC ............... *C25D 5/48* (2013.01); *C25D 7/123* (2013.01); *G03F 7/427* (2013.01); *H01J 37/32357* (2013.01); *H01J 37/32889* (2013.01); *H01J 37/32899* (2013.01); *H01L 21/0273* (2013.01); *H01L 21/6723* (2013.01); *H01L 21/76862* (2013.01); *H01L 21/76873* (2013.01)

(58) Field of Classification Search
CPC  C25D 5/48; H01J 37/32899; H01J 37/32889; H01J 37/32357
See application file for complete search history.

(56) References Cited

U.S. PATENT DOCUMENTS

| | | | |
|---|---|---|---|
| 4,904,621 A | 2/1990 | Loewenstein et al. | |
| 5,252,196 A | 10/1993 | Sonnenberg et al. | |
| 5,472,563 A | 12/1995 | Kogawa et al. | |
| 5,961,772 A | 10/1999 | Selwyn | |
| 6,056,850 A | 5/2000 | Blalock et al. | |
| 6,086,956 A | 7/2000 | Fakler et al. | |
| 6,123,775 A | 9/2000 | Hao et al. | |
| 6,197,181 B1 | 3/2001 | Chen | |
| 6,204,192 B1 | 3/2001 | Zhao et al. | |
| 6,232,230 B1 | 5/2001 | Iacoponi | |
| 6,319,384 B1 | 11/2001 | Taylor et al. | |
| 6,432,821 B1 | 8/2002 | Dubin et al. | |
| 6,440,291 B1 | 8/2002 | Henri et al. | |
| 6,464,779 B1 | 10/2002 | Powell et al. | |
| 6,610,192 B1 | 8/2003 | Step et al. | |
| 6,638,411 B1 | 10/2003 | Mishima et al. | |
| 6,664,122 B1 | 12/2003 | Andryuschenko et al. | |
| 6,680,540 B2 | 1/2004 | Nakano et al. | |
| 6,699,380 B1 | 3/2004 | Chen et al. | |
| 6,709,523 B1 | 3/2004 | Toshima et al. | |
| 6,720,204 B2 | 4/2004 | Sudijono et al. | |
| 6,743,719 B1 | 6/2004 | Chen et al. | |
| 6,764,952 B1 | 7/2004 | Yu et al. | |
| 6,793,796 B2 | 9/2004 | Reid et al. | |
| 6,815,349 B1 | 11/2004 | Minshall et al. | |
| 6,844,258 B1 | 1/2005 | Fair et al. | |
| 6,849,122 B1 | 2/2005 | Fair | |
| 6,902,605 B2 | 6/2005 | Kolics et al. | |
| 6,946,401 B2 | 9/2005 | Huang et al. | |
| 6,962,873 B1 | 11/2005 | Park | |
| 7,232,513 B1 | 6/2007 | Webb et al. | |
| 7,265,061 B1 | 9/2007 | Cho et al. | |
| 7,327,948 B1 | 2/2008 | Shrinivasan et al. | |
| 7,405,157 B1 | 7/2008 | Reid et al. | |
| 7,442,267 B1 | 10/2008 | Webb et al. | |
| 7,456,102 B1 | 11/2008 | Varadarajan et al. | |
| 7,799,684 B1 | 9/2010 | Reid et al. | |
| 7,851,232 B2 | 12/2010 | Van Schravendijk et al. | |
| 7,874,218 B2 | 1/2011 | Izumi et al. | |
| 7,879,218 B1 | 2/2011 | Webb et al. | |
| 7,897,198 B1 | 3/2011 | Parks et al. | |
| 7,941,039 B1 | 5/2011 | Shrinivasan et al. | |
| 7,964,506 B1 | 6/2011 | Ponnuswamy et al. | |
| 8,033,771 B1 | 10/2011 | Gage et al. | |
| 8,043,958 B1 | 10/2011 | Reid et al. | |
| 8,084,339 B2 | 12/2011 | Antonelli et al. | |
| 8,084,399 B2 | 12/2011 | Yu et al. | |
| 8,137,465 B1 | 3/2012 | Shrinivasan et al. | |
| 8,137,467 B2 | 3/2012 | Meinhold et al. | |
| 8,197,662 B1 | 6/2012 | Webb et al. | |
| 8,217,513 B2 | 7/2012 | Antonelli et al. | |
| 8,242,028 B1 | 8/2012 | Van Schravendijk et al. | |
| 8,288,288 B1 | 10/2012 | Gage et al. | |
| 8,371,567 B2 | 2/2013 | Angelov et al. | |
| 8,372,754 B2 | 2/2013 | Hanson et al. | |
| 8,471,171 B2 | 6/2013 | Price et al. | |
| 9,070,750 B2 | 6/2015 | Spurlin et al. | |
| 2001/0013473 A1 | 8/2001 | Taylor | |
| 2001/0014373 A1 | 8/2001 | Lin et al. | |
| 2001/0015321 A1 | 8/2001 | Reid et al. | |
| 2002/0008034 A1 | 1/2002 | Chen et al. | |
| 2002/0195352 A1 | 12/2002 | Mayer et al. | |
| 2003/0001271 A1 | 1/2003 | Uozumi | |
| 2003/0017628 A1 | 1/2003 | Li et al. | |
| 2003/0036280 A1 | 2/2003 | Jain et al. | |
| 2003/0051665 A1 | 3/2003 | Zhao et al. | |
| 2003/0213561 A1 | 11/2003 | Selwyn et al. | |
| 2004/0000488 A1 | 1/2004 | Yang | |
| 2004/0050685 A1 | 3/2004 | Yara et al. | |
| 2004/0052028 A1 | 3/2004 | O'Reilly et al. | |
| 2004/0084301 A1 | 5/2004 | Dordi et al. | |
| 2004/0118697 A1 | 6/2004 | Wen+ et al. | |
| 2004/0142557 A1 | 7/2004 | Levy et al. | |
| 2004/0200244 A1 | 10/2004 | Hong et al. | |
| 2004/0217009 A1 | 11/2004 | Mikkola et al. | |
| 2004/0226827 A1 | 11/2004 | Matsuda et al. | |
| 2005/0020057 A1 | 1/2005 | Kudo et al. | |
| 2005/0167404 A1 | 8/2005 | Yamazaki | |
| 2005/0208754 A1 | 9/2005 | Kostamo et al. | |
| 2006/0223310 A1 | 10/2006 | Suzuki | |
| 2006/0283716 A1 | 12/2006 | Hafezi et al. | |
| 2007/0062818 A1 | 3/2007 | Daviot et al. | |
| 2008/0152822 A1 | 6/2008 | Vaskelis et al. | |
| 2008/0213994 A1 | 9/2008 | Chebiam et al. | |
| 2009/0095220 A1 | 4/2009 | Meinhold et al. | |
| 2009/0277867 A1 | 11/2009 | Mayer et al. | |
| 2010/0108491 A1 | 5/2010 | Yoon et al. | |
| 2010/0200412 A1 | 8/2010 | Reid et al. | |
| 2010/0317178 A1 | 12/2010 | Antonelli et al. | |
| 2010/0320081 A1 | 12/2010 | Mayer et al. | |
| 2011/0146571 A1 | 6/2011 | Bartlett et al. | |
| 2012/0211473 A1 | 8/2012 | Goto et al. | |
| 2013/0171833 A1 | 7/2013 | Buckalew et al. | |
| 2014/0199497 A1 | 7/2014 | Spurlin et al. | |
| 2014/0256127 A1 | 9/2014 | Spurlin et al. | |
| 2014/0256128 A1 | 9/2014 | Spurlin et al. | |
| 2014/0357089 A1 | 12/2014 | Buckalew et al. | |
| 2015/0072538 A1 | 3/2015 | Spurlin et al. | |
| 2015/0218724 A1 | 8/2015 | Mevellec et al. | |
| 2015/0299886 A1 | 10/2015 | Doubina et al. | |
| 2015/0303065 A1 | 10/2015 | Buckalew et al. | |
| 2015/0376792 A1 | 12/2015 | Spurlin et al. | |
| 2016/0111342 A1 | 4/2016 | Huang et al. | |
| 2016/0111344 A1 | 4/2016 | Opocensky et al. | |

FOREIGN PATENT DOCUMENTS

| | | |
|---|---|---|
| CN | 102804338 A | 11/2012 |
| WO | WO 2014/014907 | 1/2014 |
| WO | WO 2014/044942 | 3/2014 |

OTHER PUBLICATIONS

U.S. Application titled, "Deposit Morphology of Electroplated Copper After Selective Removal of Copper Oxides During Pretreatment," Webb et al., filed Jul. 11, 2012, U.S. Appl. No. 13/546,146.

US Office Action, dated Dec. 9, 2014, issued in U.S. Appl. No. 13/741,151.

US Office Action, dated Jul. 18, 2014, issued in U.S. Appl. No. 13/787,499.

US Notice of Allowance, dated Feb. 6, 2015, issued in U.S. Appl. No. 13/787,499.

US Office Action, dated May 6, 2015, issued in U.S. Appl. No. 14/020,339.

(56) References Cited

OTHER PUBLICATIONS

US Office Action, dated Dec. 3, 2014, issued in U.S. Appl. No. 14/086,770.
US Final Office Action, dated May 20, 2015, issued in U.S. Appl. No. 14/086,770.
US Office Action, dated Oct. 23, 2015, issued in U.S. Appl. No. 14/086,770.
US Final Office Action, dated Apr. 22, 2016, issued in U.S. Appl. No. 14/086,770.
US Notiec of Allowance, dated Jun. 21, 2016, issued in U.S. Appl. No. 14/257,744.
US Office Action, dated Feb. 5, 2016, issued in U.S. Appl. No. 14/256,671.
US Final Office Action, dated May 19, 2016, issued in U.S. Appl. No. 14/256,671.
US Office Action, dated Feb. 2, 2016, issued in U.S. Appl. No. 14/320,171.
US Office Action dated Mar. 9, 2016, issued in U.S. Appl. No. 14/657,956.
US Notice of Allowance dated Jun. 22, 2016, issued in U.S. Appl. No. 14/657,956.
US Office Action, dated Oct. 18, 2005, issued in U.S. Appl. No. 10/741,048.
US Office Action, dated Mar. 9, 2006, issued in U.S. Appl. No. 10/741,048.
US Office Action, dated Mar. 17, 2006, issued in U.S. Appl. No. 10/741,048.
US Final Office Action, dated Jul. 18, 2006, issued in U.S. Appl. No. 10/741,048.
US Office Action, dated Nov. 27, 2006, issued in U.S. Appl. No. 10/741,048.
US Final Office Action, dated Apr. 24, 2007, issued in U.S. Appl. No. 10/741,048.
US Office Action, dated Aug. 9, 2007, issued in U.S. Appl. No. 10/741,048.
US Final Office Action, dated Dec. 14, 2007, issued in U.S. Appl. No. 10/741,048.
US Examiner's Answer Before the Board of Patent Appeals and Interferences, dated Jun. 18, 2008, issued in U.S. Appl. No. 10/741,048.
US Examiner's Decision on Appeal Before the Board of Patent Appeals and Interferences, dated Sep. 17, 2010, issued in U.S. Appl. No. 10/741,048.
US Notice of Allowance, dated Sep. 23, 2010, issued in U.S. Appl. No. 10/741,048.
US Notice of Allowance, dated Feb. 23, 2012, issued in U.S. Appl. No. 12/971,367.
US Office Action, dated May 1, 2013, issued in U.S. Appl. No. 13/493,933.
US Office Action, dated Aug. 13, 2015, issued in U.S. Appl. No. 13/546,146.
US Final Office Action, dated Feb. 26, 2016, issued in U.S. Appl. No. 13/546,146.
Chinese First Office Action, dated Apr. 1, 2016, issued in Application No. CN 201410080405.0.
Chavez et al., (2001) "A Novel Method of Etching Copper Oxide Using Acetic Acid" Journal of the Electrochemical Society,148(11):G640-G643.

PRETREATMENT METHOD FOR PHOTORESIST WAFER PROCESSING

CROSS-REFERENCE TO RELATED APPLICATION

This application is a divisional of and claims priority to U.S. application Ser. No. 14/257,744, titled "PRETREATMENT METHOD FOR PHOTORESIST WAFER PROCESSING," filed Apr. 21, 2014, all of which is incorporated herein by this reference and for all purposes.

BACKGROUND

This disclosure generally relates to wafer level packaging for integrated circuit packages. Certain aspects of this disclosure pertain to methods and apparatus for treating a partially fabricated semiconductor substrate after a layer of photoresist is patterned, and before material is electroplated into the features on the patterned photoresist.

Integrated circuit (IC) chips or dies are typically interfaced with other circuits using a package that can be connected to, e.g., a printed circuit board (PCB). In some cases, IC packaging includes wafer level packaging (WLP), which is an electrical connection technology that employs relatively large features, typically on the scale of micrometers. WLP is a form of packaging fabricated on the wafer before it is cut into dies. Examples of WLP structures include redistribution wiring, bumps, and pillars.

The packaging standard may be specified industry-wide or may be specific to a particular company or group of companies. For example, an IC die can be packaged as an industry standard ball grid array (BGA) package. A BGA package has an array of solder ball pads positioned on a bottom surface of a substrate, where solder balls contact the pads/ports of a PCB and the solder balls are reflowed to attach to the package of a PCB. In such an implementation of a BGA package, wire bonds are connected between pads/ports of the die and electrical features of the substrate.

Some WLP processes include deposition of a metal seed layer, followed by deposition of a layer of photoresist. The photoresist is then patterned through exposure to light, and portions of the resist are removed to form features (e.g., holes, pads, lines, etc.) in a photoresist development operation. The development process should expose the underlying metal seed layer, which is later used as a conductive surface to initiate electrodeposition within the features. However, some amount of photoresist or other residues will often remain on the seed layer after this development process. The residues are often referred to as "photoresist scum" or more simply "scum." Photoresist scum may be caused by incomplete removal of photoresist within the features and by the formation of organic residues during the development process. The scum can interfere with later electroplating processes. For example, residues on the portions of the seed layer where electroplating takes place may affect the seed layer's adhesion to subsequently electroplated materials. Further, the presence of residues on the seed layer may lead to poor wetting and additive adsorption during electroplating, which contribute to poor electroplating results.

In many cases, photoresist remnants are removed from the seed layer through a process referred to as "descumming." Conventional descumming processes involve exposing the substrate to an oxygen-based plasma. In many cases, the gas used to generate the plasma is at least about 90% oxygen. The oxygen-based plasma removes the photoresist scum from the bottom of the features, leaving a resist-free seed layer upon which electroplating can take place. However, conventional descumming processes involve certain drawbacks including potential oxidation of the seed layer. Therefore, improved methods of removing photoresist scum in the context of wafer level packaging processes are desired.

SUMMARY

Certain embodiments herein relate to methods and apparatus for processing a semiconductor substrate in a remote plasma environment. The methods may be performed in the context of wafer level packaging (WLP) processes. The methods may include exposing the substrate to a reducing plasma to remove photoresist scum and/or oxidation from an underlying seed layer. In some cases, photoresist scum is removed through a series of plasma treatments involving exposure to an oxygen-containing plasma followed by exposure to a reducing plasma. In some embodiments, an oxygen-containing plasma is further used to strip photoresist from a substrate surface after electroplating. This plasma strip may be followed by a plasma treatment involving exposure to a reducing plasma. The plasma treatments herein may involve exposure to a remote plasma within a plasma treatment module of a multi-tool electroplating apparatus.

In one aspect of the disclosed embodiments, a method of removing photoresist scum and electroplating metal into photoresist features is provided, the method including: (a) receiving a substrate in a multi-tool electroplating apparatus including: (i) at least one plasma treatment module having a plasma treatment chamber and a plasma generation chamber connected to the plasma treatment chamber; and (ii) at least one electroplating module having an electroplating chamber; where the substrate includes (i) a metal seed layer, and (ii) a layer of photoresist over and directly in contact with the metal seed layer, where the layer of photoresist includes photoresist features patterned therein, and where a bottom of the photoresist features includes photoresist scum; (b) generating a reducing plasma from a reducing plasma generation gas in the plasma generation chamber; (c) flowing the reducing plasma from the plasma generation chamber into the plasma treatment chamber to thereby expose the substrate to the reducing plasma, react the photoresist scum with the reducing plasma, and remove at least a portion of the photoresist scum; and (d) transferring the substrate to the electroplating module and electroplating metal on the metal seed layer in the photoresist features.

In certain embodiments, the reducing plasma generation gas includes one or more of hydrogen, ammonia, nitrogen, carbon monoxide, diborane, sulfite compounds, hydrocarbons, phosphites, and/or hydrazine. The reducing plasma generation gas includes hydrogen in various cases.

The method may further include (e) after electroplating in (d), transferring the substrate to the plasma treatment chamber, generating a stripping plasma in the plasma generation chamber from a stripping plasma generation gas, flowing the stripping plasma from the plasma generation chamber into the plasma treatment chamber, exposing the substrate to the stripping plasma, and thereby reacting the stripping plasma with the layer of photoresist to strip the layer of photoresist from the substrate. The stripping plasma generation gas may include oxygen and/or $CO_2$ in some cases.

In some cases, operation (e) forms oxidized portions of the metal seed layer. In this case, the method may further include (f) after stripping the layer of photoresist in (e), generating a second reducing plasma in the plasma generation chamber from a second reducing plasma generation gas, flowing the second reducing plasma from the plasma generation chamber into the plasma treatment chamber, exposing the substrate to the second reducing plasma, and thereby reacting the oxidized portions of the metal seed layer with the second reducing plasma to reduce the oxidized portions of the metal seed layer. The second reducing plasma generation gas may include one or more of hydrogen, ammonia, nitrogen, carbon monoxide, diborane, sulfite compounds, hydrocarbons, and/or hydrazine. In some embodiments the reducing plasma is substantially free of oxidizing species. The second reducing plasma may also be substantially free of oxidizing species. In some implementations, the layer of photoresist is not exposed to an oxidizing plasma between the time it is developed and the time at which operations (b)-(c) occur.

In another aspect of the disclosed embodiments, an additional method of removing photoresist scum and electroplating metal into photoresist features is provided, the method including: (a) receiving a substrate in a multi-tool electroplating apparatus, the multi-tool electroplating apparatus including: (i) a plasma treatment module including a plasma treatment chamber and a plasma generation chamber connected to the plasma treatment chamber; and (ii) an electroplating module including an electroplating chamber; where the substrate includes: (i) a metal seed layer, and (ii) a layer of photoresist over and directly in contact with the metal seed layer, where the layer of photoresist has photoresist features patterned therein, and where a bottom of the photoresist features includes photoresist scum; (b) generating a first oxidizing plasma from a first oxidizing plasma generation gas in the plasma generation chamber and flowing the first oxidizing plasma from the plasma generation chamber into the plasma treatment chamber to thereby expose the substrate to the first oxidizing plasma and react the photoresist scum with the first oxidizing plasma, to thereby remove at least a portion of the photoresist scum and oxidize a portion of the metal seed layer; (c) generating a reducing plasma from a reducing plasma generation gas in the plasma generation chamber and flowing the reducing plasma from the plasma generation chamber into the plasma treatment chamber to thereby expose the substrate to the reducing plasma and react the oxidized portion of the metal seed layer with the reducing plasma, to thereby reduce the oxidized portions of the metal seed layer; and (d) transferring the substrate to the electroplating module and electroplating metal on the metal seed layer in the photoresist features.

In some embodiments, the reducing plasma generation gas includes one or more of hydrogen, ammonia, nitrogen, carbon monoxide, diborane, sulfite compounds, hydrocarbons, phosphites, and/or hydrazine. The reducing plasma generation gas includes hydrogen in many cases.

In some implementations, the method further includes (e) after electroplating in (d), transferring the substrate to the plasma treatment chamber, generating a stripping plasma in the plasma generation chamber from a stripping plasma generation gas, flowing the stripping plasma from the plasma generation chamber into the plasma treatment chamber, exposing the substrate to the stripping plasma, and thereby reacting the stripping plasma with the layer of photoresist to strip the layer of photoresist from the substrate. This may result in the formation of oxidized portions of the metal seed layer. As such, the method may further include (f) after stripping the layer of photoresist in (e), generating a second reducing plasma in the plasma generation chamber from a second reducing plasma generation gas, flowing the second reducing plasma from the plasma generation chamber into the plasma treatment chamber, and exposing the substrate to the second reducing plasma to thereby react the oxidized portions of the metal seed layer with the second reducing plasma to reduce the oxidized portions of the metal seed layer. The second reducing plasma generation gas may include one or more of hydrogen, ammonia, nitrogen, carbon monoxide, diborane, sulfite compounds, hydrocarbons, phosphites, and/or hydrazine. The photoresist features may define the geometry of at least one wafer level packaging structure in various cases.

In a further aspect of the disclosed embodiments, a multi-tool electroplating apparatus for removing photoresist scum and electroplating metal in features on a semiconductor substrate having a metal seed layer under an exposed layer of patterned photoresist is provided, including: (i) a plasma treatment module including a plasma treatment chamber connected with a plasma generation chamber; (ii) an electroplating module including an electroplating chamber; (iii) a transfer mechanism for transferring the substrate between the plasma treatment module and the electroplating module; and (iv) a controller having instructions to: (a) transfer the substrate into the plasma treatment chamber of the plasma treatment module; (b) generate a reducing plasma in the plasma generation chamber from a reducing plasma generation gas, and flow the reducing plasma from the plasma generation chamber into the plasma treatment chamber to thereby expose the substrate to the reducing plasma and react the photoresist scum with the reducing plasma to remove at least a portion of the photoresist scum; (c) transfer the substrate from the plasma treatment chamber to the electroplating chamber via the transfer mechanism; and (d) electroplate metal on the metal seed layer in the features in the patterned photoresist.

In certain cases, the controller may further have instructions to: (e) after electroplating in (d), transfer the substrate from the electroplating chamber to the plasma treatment chamber via the transfer mechanism; and (f) generate a stripping plasma in the plasma generation chamber from a stripping plasma generation gas, and flow the stripping plasma from the plasma generation chamber into the plasma treatment chamber to thereby expose the substrate to the stripping plasma and react the stripping plasma with the layer of patterned photoresist to strip the patterned photoresist from the substrate. The controller may also have instructions to: (g) after stripping photoresist in (f), generate a second reducing plasma in the plasma generation chamber from a second reducing plasma generation gas, and flow the second reducing plasma from the plasma generation chamber into the plasma treatment chamber to thereby expose the substrate to the second reducing plasma and react the second reducing plasma with oxidized portions of the metal seed layer to thereby reduce the oxidized portions of the metal seed layer.

In another aspect of the disclosed embodiments, a multi-tool electroplating apparatus for removing photoresist scum and electroplating metal in features on a semiconductor substrate having a metal seed layer under an exposed layer of patterned photoresist is provided, including: (i) a plasma treatment module including a plasma treatment chamber connected with a plasma generation chamber; (ii) an electroplating module having an electroplating chamber; (iii) a transfer mechanism for transferring the substrate between the plasma treatment module and the electroplating module; and (iv) a controller having instructions to: (a) transfer the substrate into the plasma treatment chamber of the plasma treatment module; (b) generate a first oxidizing plasma in the plasma generation chamber from a first oxidizing plasma generation gas, and flow the first oxidizing plasma from the plasma generation chamber into the plasma treatment chamber to thereby expose the substrate to the first oxidizing plasma and react the first oxidizing plasma with the photoresist scum to remove at least a portion of the photoresist scum and form oxidized portions of the metal seed layer; (c) generate a reducing plasma in the plasma generation chamber from a reducing plasma generation gas, and flow the reducing plasma from the plasma generation chamber into the plasma treatment chamber to thereby expose the substrate to the reducing plasma and react the oxidized portions of the metal seed layer with the reducing plasma to reduce the oxidized portions of the metal seed layer; (d) transfer the substrate from the plasma treatment chamber to the electroplating chamber via the transfer mechanism; and (e) electroplate metal on the metal seed layer in the features in the patterned photoresist.

The controller may also have instructions to (f) after electroplating in (e), transfer the substrate from the electroplating chamber to the plasma treatment chamber via the transfer mechanism; and (g) generate a stripping plasma in the plasma generation chamber from a stripping plasma generation gas, and flow the stripping plasma from the plasma generation chamber into the plasma treatment chamber to thereby expose the substrate to the stripping plasma and react the stripping plasma with the layer of patterned photoresist to strip the patterned photoresist from the substrate. In some cases, operation (g) results in formation of oxidized portions of the metal seed layer, and the controller further has instructions to (h) after stripping photoresist in (g), generate a second reducing plasma in the plasma generation chamber from a second reducing plasma generation gas, and flow the second reducing plasma from the plasma generation chamber into the plasma treatment chamber to thereby expose the substrate to the second reducing plasma and react the second reducing plasma with the oxidized portions of the metal seed layer to reduce the oxidized portions of the metal seed layer.

These and other features will be described below with reference to the associated drawings.

DETAILED DESCRIPTION

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The flow rates and RF times presented herein are appropriate for a 300 mm wafer, and may be scaled as appropriate for wafers of others sizes. These variables may scale linearly based on substrate area. For example, a reported RF power value of about 500 W/station for a 300 mm wafer would scale to a power of about 1125 W/station for a 450 mm wafer. Similarly, a flow rate of about 100 sccm for a 300 mm wafer would scale to a flow rate of about 225 sccm for a 450 mm wafer.

Further, the terms "electrolyte," "plating bath," "bath," and "plating solution" are used interchangeably, as are the terms "photoresist" and "resist." The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards and the like.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Although the present disclosure may be used in a variety of applications, one very useful application is in wafer level packaging (WLP) commonly used in the manufacture of semiconductor packages. WLP applications may include metal interconnects, including routing layers such as copper redistribution layers (RDLs). A solder structure may form a solder interface with such metal interconnects.

Figure 1A:
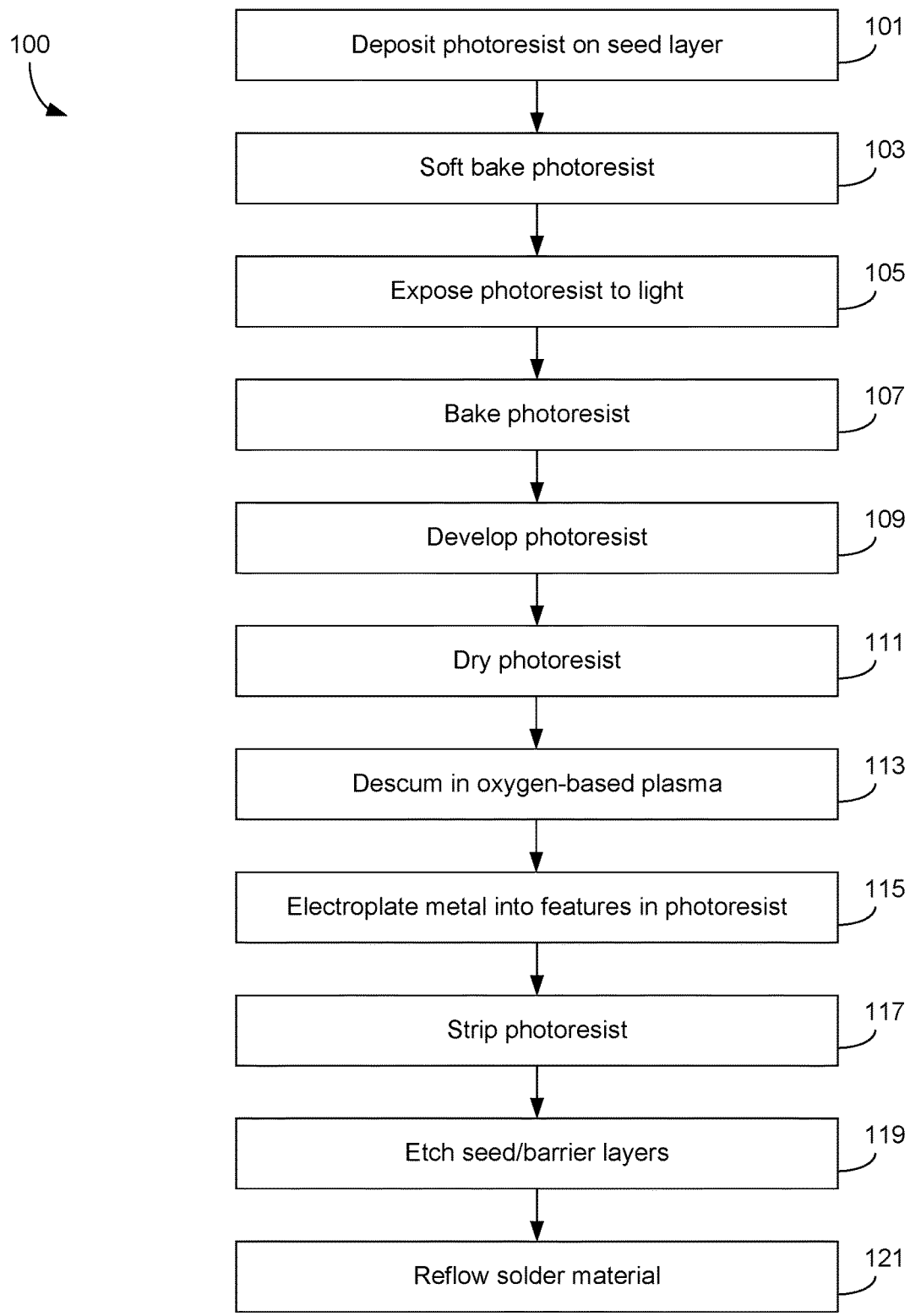
FIG. 1A is a flowchart for a method of performing wafer level packaging including an oxygen-based plasma descumming treatment.
Figure 1B:
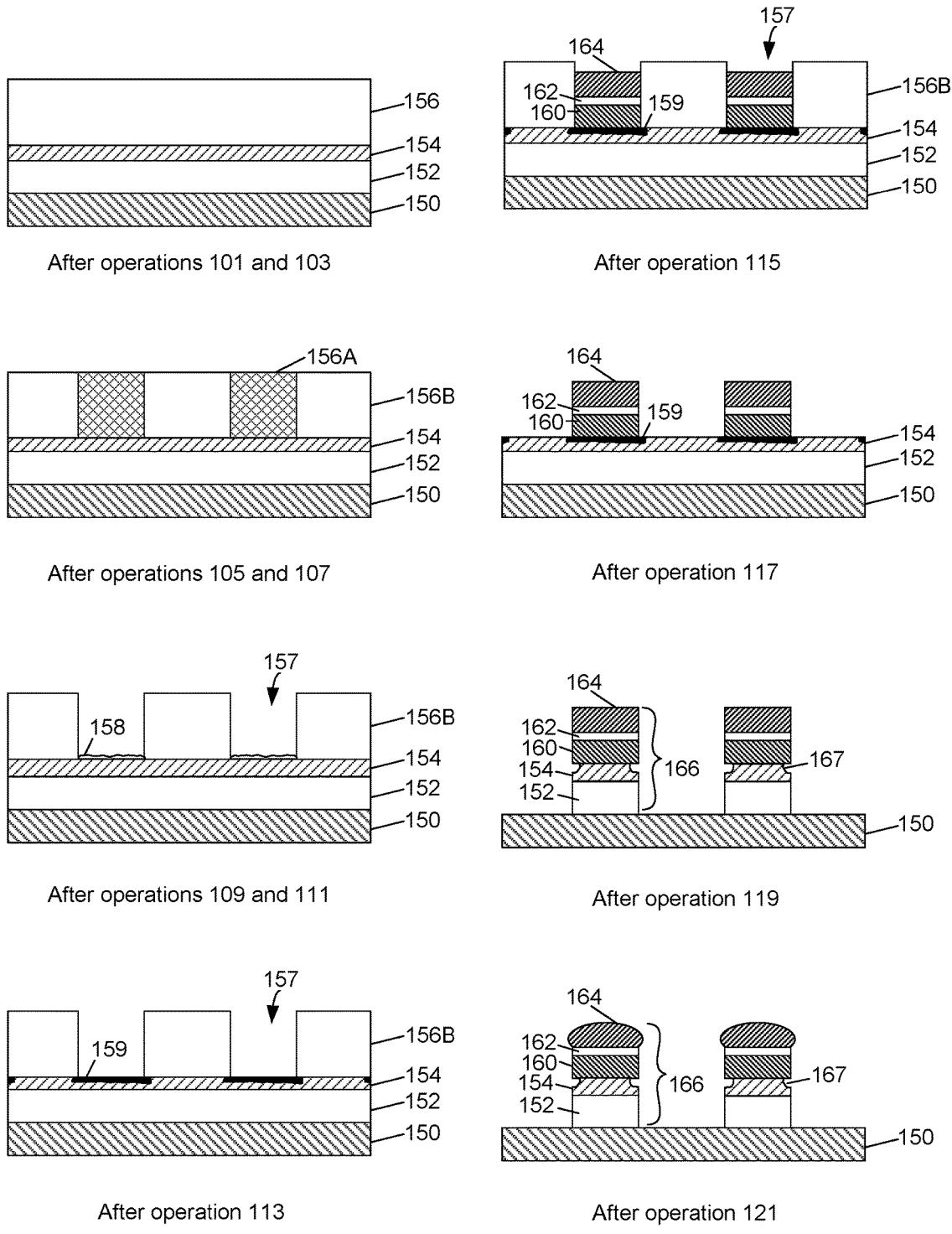
FIG. 1B provides cross-sectional views of partially fabricated semiconductor devices at the various stages shown in FIG. 1A.

FIG. 1A provides an exemplary process flow illustrating one method for performing wafer level packaging processes. FIG. 1B illustrates a cross-sectional view of a semiconductor substrate at the various steps shown in FIG. 1A. FIG. 1B is provided to facilitate understanding and is not shown to scale (the layers shown may have different relative thicknesses, or may be made from different materials, for example). The method 100 begins at operation 101, where a layer of photoresist 156 is deposited on a metal seed layer 154. The seed layer 154 may be positioned atop a barrier layer 152 and substrate 150. In many cases the substrate 150 is a partially fabricated semiconductor substrate that is nearly complete, including various devices within the underlying layers. The metal seed layer 154 may be copper, though other metals may be used, as well. The photoresist 156 may be deposited through any available method. In many cases, spin-on techniques are used to deposit the resist. These techniques may involve applying a viscous liquid solution of photoresist on a wafer, and rapidly spinning the wafer to produce a thin layer of resist having substantially uniform thickness. In certain embodiments, the wafer is spun at between about 1200-4800 RPM for a period between about 30-60 seconds. Other rotation rates and durations may be used as appropriate. The photoresist layer produced may be between about 0.5-120 μm thick or between about 1-70 μm thick.

The substrate may then go through a soft baking process in operation 103 to remove substantially all of the solvents used to spin coat the resist onto the substrate. The soft bake may include heating the substrate to an elevated temperature (e.g., between about 80-100° C., for example 90-100° C.) for a period of time (e.g., between about 30-60 seconds). The soft bake is sometimes referred to as a pre-bake. After the soft bake, the photoresist is substantially dry. Next, at operation 105 the substrate is exposed to a pattern of intense light. The light is patterned through the use of a mask (sometimes called a reticle) that selectively blocks and transmits light as desired. An optical system shines light through the mask such that the desired pattern of light is illuminated on the layer of photoresist. This light exposure causes a chemical change within the exposed areas of the resist 156A. The chemical change allows either the exposed resist 156A or unexposed resist 156B to be removed in a subsequent development operation 109 (where a positive photoresist is used, exposed areas 156A will be removed, and where a negative photoresist is used, unexposed areas 156B will be removed).

After the photoresist 156A is exposed to light in operation 105, and before the resist 156A and 156B is developed in operation 109, an additional baking process occurs at operation 107. This baking operation 107 may be referred to as a post exposure bake (PEB), and may be undertaken to help reduce standing wave phenomena that arise due to destructive and constructive interference patterns of the incident light. The PEB operation 107 may also help complete the photoreaction initiated by exposure, particularly when using chemically amplified resists. In certain cases, particularly where a crosslinking negative resist is used, the PEB may help promote crosslinking. Further, the PEB may reduce mechanical stress that formed during the soft bake in operation 103 and exposure to light in operation 105. In one example, a PEB process involves heating the wafer to an elevated temperature (e.g., between about 100-120° C.) for a period of time (e.g., between about 1-2 minutes).

Next, the photoresist 156A and 156B may be developed in operation 109. As mentioned above, in cases where a positive photoresist is used, the exposed areas 156A are removed, and where a negative resist is used, the non-exposed areas 156B are removed. In the example shown in FIG. 1B, a positive resist is used and the exposed areas 156A are removed during the development operation 109. In various cases, the developer chemistry is a liquid reactant that is delivered to the wafer through a spin-on process. The developer chemistry may include a metal-ion-free developer in certain cases, for example tetramethylammonium hydroxide (TMAH). Other developers may be used, as well. Because of the chemical reactions that occurred in portions of the photoresist that were exposed in operation 105, the resist may be selectively removed from the substrate as it is developed in operation 109. This selective removal leaves behind a layer of photoresist with features 157 patterned therein.

The substrate is then cleaned and dried in operation 111 to remove excess developer chemistry and prepare the substrate for further processing. This may be accomplished in various ways. In one example, a Marangoni dryer (sometimes referred to as a surface tension gradient dryer, STG dryer, gradient dryer, etc.) is used. Where this is the case, wafers are submerged in water that is coated with a thin layer of isopropyl alcohol (IPA). The wafers are then slowly drawn out of the water, through the thin layer of IPA. The wafers are dried as they are pulled out of the water due to the surface tension gradient that is present between the water and IPA. Other potential drying methods include spin drying and IPA vapor drying, for example.

Ideally, the substrate would be ready for further processing at this point, for example to electroplate metal into the features 157 etched into the photoresist 156B. However, the development operation 109 typically leaves a thin layer of photoresist scum 158 on the bottom of features, i.e., on the seed layer 154. This scum 158 can deleteriously affect subsequent electroplating processes. For example, the scum 158 can affect the wettability of the photoresist and seed layer, as well as the attachment of electroplating additives used to promote bottom-up fill during electroplating. These issues cause poor electroplating results. Further, the presence of scum 158 can lead to poor adhesion between the seed layer 154 and the electroplated metal 160. Therefore, before metal can be electroplated into the features 157, a descum process takes place at operation 113.

In certain cases, the descum operation 113 involves exposure to a remote or in situ oxygen-based plasma in a descum tool dedicated to such processes. The descum tool is generally a standalone tool that is not incorporated into another processing apparatus. The descum tool may include a processing chamber and a plasma generation chamber upstream from the processing chamber. Plasma is generated from a plasma generation gas in the plasma generation chamber before traveling down into the processing chamber. The characteristics of the plasma may change as it is delivered to the processing chamber. Process details related to the oxygen-based descumming operation are included below.

The descumming process leaves behind a substantially scum-free seed layer 154 upon which electroplating can take place. However, where an oxygen-based plasma is used to descum the substrate in a standalone tool, certain problems can arise. For example, the oxygen-based descum process results in oxidation of the metal seed layer 154 to form oxidized seed material 159. Moreover, oxidation of the metal seed layer is promoted where the substrate experiences downtime between the descum process in operation 113 and the electroplating process in operation 115. Longer queue times are more likely to cause or exacerbate oxidation. Further, transfer of the substrate from a descumming tool to an electroplating tool can promote oxidation of the metal seed layer. This oxidation can result in an undesirable final shape of a WLP pillar, as explained further below. In some cases, metal oxide 159 present on the seed layer 154 is removed by chemical dissolution in a chemical bath (not shown in FIGS. 1A and 1B). The chemical bath may be an electroplating solution, for example an electroplating solution for plating copper.

This chemical dissolution method is not ideal. For example, it can result in metallic contamination of the chemical bath (which is especially problematic if the chemical bath is also used for electroplating). Further, displacement reactions may occur at the wafer surface, thereby potentially compromising the substrate. In one example, a nickel UBM layer is electrodeposited and then rinse and dried, and then exposed to the atmosphere which results in NiOx layer. After exposure to an oxygen-based plasma in the descumming operation, the substrate may be placed in a solution used to electroplate copper to dissolve any nickel oxide material formed during descumming and wafer transfer. The copper electroplating solution may undergo displacement reactions with the nickel oxide.

Returning FIG. 1A, the method continues at operation 115, where metal is electroplated into the features 157. Example materials include copper, nickel, tin, tin alloys (e.g., tin-silver, tin-copper, tin-silver-copper, tin-lead), etc. The tin-based materials are typically used as a solder to electrically connect input and output pads of the integrated circuits to external circuitry such as printed circuit boards. In various cases, two or more types of metal are plated in succession. In a particular example shown in FIG. 1B, three different layers are deposited: a copper pillar layer 160, a nickel diffusion barrier layer 162 and a tin-silver solder cap layer 164. Each of these layers may be deposited through electroplating. Electroplating methods are further discussed in relation to FIGS. 2, 4B, 5B, 6B, and 7B.

In some cases, however, the solder material (e.g., the tin-silver or other tin-containing material), may be deposited through other means. In these embodiments, the solder material may be mechanically dropped or otherwise placed to contact a pad of an electroplated (often copper-containing) structure. This may occur later in the fabrication process, for example after the photoresist is removed in operation 117, and after the seed and barrier layers are etched in operation 119. After the solder material is placed into contact with a pad of an electroplated structure, the solder material may be reflowed to form a solder joint with the electroplated structure.

After the desired materials are electroplated into the feature 157, the photoresist 156B may be stripped from the substrate in operation 117. In some embodiments, photoresist stripping includes placing the substrate in a substrate holder of a stripping module and immersing the substrate in stripping solution. The substrate may be rotated as the resist is stripped. Example stripping solutions include dimethyl sulfoxide-(DMSO) and tetramethyl ammonium hydroxide-(TMAH) based solutions. Photoresist stripping methods and apparatus are further discussed and described in U.S. patent application Ser. No. 13/904,283, filed May 29, 2013, and titled "APPARATUS FOR ADVANCED PACKAGING APPLICATIONS," which is herein incorporated by reference in its entirety. In some cases, the photoresist is removed through a dry etching process in operation 117, rather than a wet etching process. In dry stripping processes for removing resist, oxygen-based plasmas are typically used. In some cases, the removal chemistry includes hydrogen and a weak oxidizing agent such as carbon dioxide.

Next, the seed layer 154 and barrier layer 152 are etched at operation 119. If the seed layer 154 were not etched between the electroplated materials, the in-tact metallic seed layer 154 would form a short between all of the underlying structures, and the device would not function as desired. As noted above, the device shown in FIG. 1B is not presented to scale. For instance, the seed layer 154 may be much thinner than shown, relative to the photoresist 156 and electroplated materials 160, 162, and 164. In various embodiments, the seed layer 154 and barrier layer 152 are removed through wet chemical etching processes. The seed layer may be removed first, as it is positioned above the barrier layer. Typically, different etching solutions will be used to remove the seed and barrier layers. One example of a solution that may be used to etch the seed layer is dilute piranha solution (a mixture of $H_2SO_4$ and $H_2O_2$), and an example of a solution that may be used to etch the barrier layer is 30% $H_2O_2$ in water, though these are not intended to be limiting.

In some embodiments, operation 117, as well as one or both parts of operation 119 (etching the seed layer and etching the barrier layer) occur in a single tool. The tool may include a Bernoulli chuck, which may be configured to position the substrate at different levels of the tool. Each level of the tool may be used for a specific process. For instance, a first level (e.g., a top level) may be used to strip the photoresist, a second level (e.g., a middle level) may be used to etch the seed layer, and a third level (e.g., a bottom level) may be used to etch the barrier layer. Each level is configured to isolate the relevant chemistry to prevent contamination of other processes. The Bernoulli chuck and methods for using the chuck are further discussed and described in the following U.S. Patents, each of which is incorporated by reference in its entirety: U.S. Pat. No. 5,513,668 filed Feb. 8, 1994, and titled "SUPPORT FOR DISK-SHAPED ARTICLES"; and U.S. Pat. No. 5,494,566, filed Feb. 8, 1994, and titled "SUPPORT FOR DISK-SHAPED ARTICLES USING THE BERNOULLI PRINCIPLE.".

After the seed layer 154 and barrier layer 152 are etched, stacks 166 remain. The layers in the stacks 166 include the barrier layer 152, seed layer 154, and the electroplated materials (e.g., the copper layer 160, nickel layer 162 and tin-silver layer 164 in FIG. 1B). These stacks 166 may also be referred to as pillars or pads. The chemistry used to etch the seed layer may be more reactive to oxides than to pure metal. As such, the oxidized seed 159 may etch at a faster rate, and to a greater extent, than the non-oxidized portions of the seed layer (and any copper 160 present in the electroplated stack 166). This difference in etching results in an undercut 167 in the seed layer 154, at locations where oxidation 159 was present. This undercut 167 persists throughout subsequent processing, and can compromise the structural integrity of the stack 166. Sufficiently extensive undercuts 167 can lead to failure of the device. Methods and apparatus for minimizing or avoiding such undercuts are discussed further below.

Where the solder material is not electroplated in operation 115, it may be added at this point in the process. As mentioned above, this may include mechanically contacting solder material (e.g., a tin-based material such as tin-silver) with the electroplated stacks. The solder material may be provided in a solder structure, e.g., a solder ball having a diameter between about 100-500 μm.

Next, the tin-based solder material 164 may be reflowed in operation 121. The reflow operation 121 typically includes carefully melting and reflowing the solder material to facilitate the subsequent formation of an electrically conductive interface at the top of the stack 166. Where the solder material is placed mechanically (as opposed to electroplated), the reflow operation 121 may also serve to establish an electrically conductive interface between the solder material and the underlying material (e.g., nickel, copper, etc.).

Figure 2:
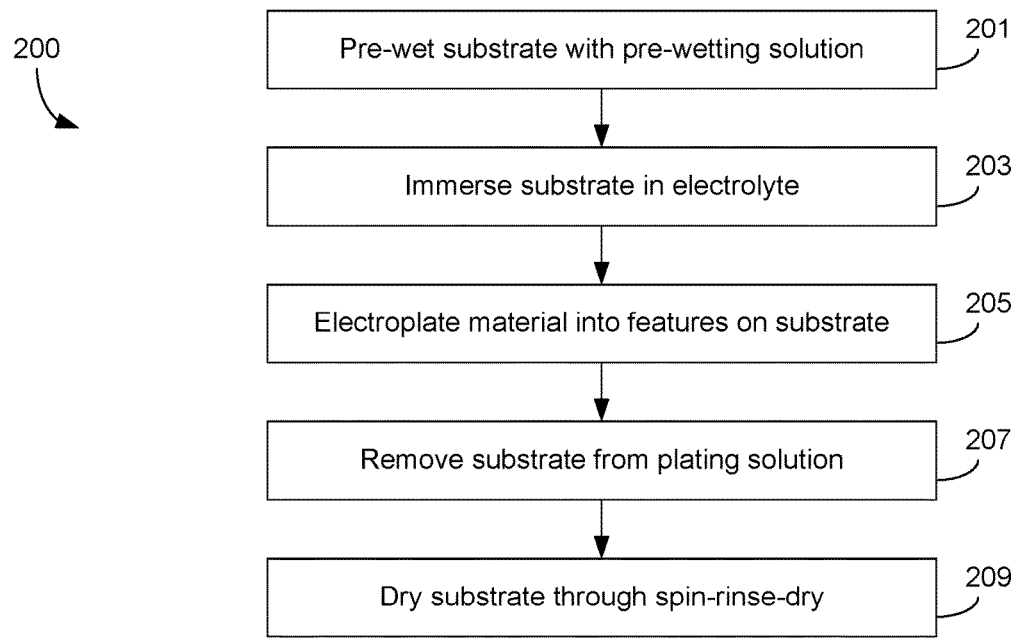
FIG. 2 is a flowchart for a method of electroplating metal into features on a substrate.

FIG. 2 provides a flowchart for a method of electroplating metal into features etched into photoresist. For context, this method would be practiced at operation 115 of FIG. 1A, and would take place in an electroplating apparatus, for example a multi-tool electroplating apparatus. The method 200 begins at operation 201 where a substrate is pre-wetted with pre-wetting solution. Pre-wetting helps reduce the likelihood that air bubbles will become entrapped within the features as the substrate is immersed in electrolyte. Pre-wetting may involve spraying the substrate with solution, for example through a jet/nozzle that shoots, mists, or otherwise delivers pre-wetting solution to the substrate. The pre-wetting solution may be deionized water. The pre-wetting solution may also be electroplating solution (e.g., it may include deionized water, acid, and a metal salt). The pre-wetting solution may be degassed (e.g., deoxygenated) prior to delivery to the substrate. Pre-wetting techniques and apparatus are further discussed in U.S. patent application Ser. No. 12/684,787, filed Jan. 8, 2010, and titled "WETTING PRETREATMENT FOR ENHANCED DAMASCENE METAL FILLING," which is herein incorporated by reference in its entirety.

Next, the substrate is immersed in electrolyte at operation 203. In many cases, the substrate is immersed at an angle to reduce the likelihood of trapping bubbles within the features. The electroplating chamber may be exposed to vacuum during immersion to further reduce the risk of bubble formation. Substrate immersion is further discussed in U.S. patent application Ser. No. 14/102,239, filed Dec. 10, 2013, and titled "ELECTROFILL VACUUM PLATING CELL" which is herein incorporated by reference in its entirety. In certain cases, the substrate may remain immersed in the electrolyte for a period of time without any electroplating occurring. This may take place to reduce the metal oxide present on the seed layer before electroplating begins. The substrate is typically rotated while it is being immersed, and such rotation continues as material is electroplated into the features at operation 205. Current is provided to the substrate to cause material to be electroplated on the seed layer, within the features in the photoresist. Electroplating methods and apparatus are further discussed in U.S. Pat. No. 6,793,796, and U.S. patent application Ser. No. 14/103,395, filed Dec. 11, 2013, and titled "ENHANCEMENT OF ELECTROLYTE HYDRODYNAMICS FOR EFFICIENT MASS TRANSFER DURING ELECTROPLATING;" Ser. No. 13/893,242, filed May 13, 2013, and titled "CROSS FLOW MANIFOLD FOR ELECTROPLATING APPARATUS;" and Ser. No. 12/640,992, filed Dec. 17, 2009, and titled "PLATING METHOD AND APPARATUS WITH MULTIPLE INTERNALLY IRRIGATED CHAMBERS," each of which is incorporated herein by reference in its entirety.

The electroplating solution typically contains certain additives (e.g., accelerators, suppressors, levelers) to cause plating to occur in a bottom-up manner. In bottom-up fill, plating occurs mainly from the bottom of the feature to the top of the feature. This achieves a void-free, seam-free fill, with minimal or no defects. Electroplating additives and bottom-up fill are further described in U.S. patent application Ser. No. 13/753,333, filed Jan. 29, 2013, and titled "LOW COPPER ELECTROPLATING SOLUTIONS FOR FILL AND DEFECT CONTROL," which is herein incorporated by reference in its entirety.

Next, the substrate is removed from electrolyte at operation 207. The substrate is then dried in operation 209, for example with a spin-rinse-dry procedure. Operations 201-209 may all occur in an electroplating module of a stand-alone or multi-tool electroplating apparatus. Such apparatus are further described below. In some cases, pre-wetting may occur in a separate pre-wetting module that is distinct from an electroplating chamber/module. The pre-wetting module may be integrated with a multi-tool electroplating apparatus. Further, the spin-rinse-dry operation may occur in a dedicated spin-rinse-dry module, which may be part of the multi-tool electroplating apparatus. The electroplating method 200 may be repeated as necessary to deposit the desired materials. In some embodiments, the electroplated materials may be deposited to an overall thickness between about 2-100 μm. For example, copper RDL may be plated to a thickness between about 1-20 μm, and a solder layer may be deposited to a thickness between about 10-80 μm.

Figure 3:
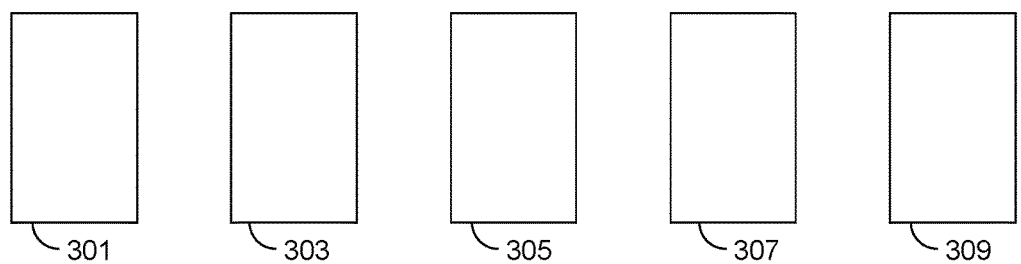
FIG. 3 schematically illustrates the various semiconductor processing apparatus used in practicing the method shown in FIGS. 1A and 2.

A number of semiconductor processing apparatus may be required to practice the method 100 shown in FIGS. 1A and 2. These distinct apparatus may be implemented as chambers, modules, cells, and the like. FIG. 3 schematically illustrates the different apparatus that are used in some cases. In one example, operation 101 (depositing photoresist on the seed layer) occurs in a spin coater tool 301. Operations 103-111 may occur in photolithography apparatus (not shown). Operation 113 (descum in oxygen-based plasma) may occur in a standalone descumming tool 303. The descumming tool may also be referred to as a plasma asher, and one example of such an apparatus is the GAMMA® tool available from Lam Research Corporation of Fremont, Calif. Operation 115, including operations 201-209 of FIG. 2, may occur in a multi-tool electroplating apparatus 305, such as a SABRE® system available from Lam Research Corporation of Fremont, Calif. Operation 117 (strip photoresist) and operation 119 (etch seed/barrier layers) may each occur in a wet strip tool 307, for example the SP304 tool available from Lam Research Corporation of Fremont, Calif. Operation 121 (reflow solder material) may occur in a reflow furnace or oven. Examples of reflow furnaces include the Pyramax™ convection reflow oven available from BTU International, Inc. in North Billerica, Mass., and the Geneva STP 300 Serial Thermal Processor available from SEMIgear, Inc. in Wakefield, Mass.

As noted above, certain factors in the processes shown in FIGS. 1A and 2 undesirably promote the formation of metal oxide on the metal seed layer. These factors may include, among others, exposure to an oxygen-containing plasma during the descumming operation, queue time between a descumming operation and an electroplating operation, and transfer of a substrate from a descumming tool to an electroplating tool. Metal seed layers can readily react with oxygen or water vapor in the air and oxidize from a pure metal film into a mixed film where metal oxide is exposed over an underlying layer of pure metal. Through the general chemical reactions shown in Equations 1 and 2, below, metals used for seed and/or barrier layers can be converted to metal oxides (Mox). The exact reaction mechanisms between the metal surfaces (M) and ambient oxygen or water vapor can vary depending on the system properties and oxidation state.

$$2M_{(s)} + O_{2(g)} \rightarrow 2MOx_{(s)} \qquad \text{Equation 1:}$$

$$2M_{(s)} + H_2O_{(g)} \rightarrow M_2Ox + H_{2(g)} \qquad \text{Equation 2:}$$

For example, copper seed deposited on substrates is known to rapidly form copper oxide upon exposure to the air. A copper oxide film can form a layer that is approximately 20 Å and upwards to 50 Å thick on top of underlying copper metal. Conversion of pure metal seed to metal oxide can lead to several problems. This is true not only with copper deposition, but also for electrodeposition processes that use different conductive metals, such as ruthenium, cobalt, silver, aluminum, and alloys of these metals. First, an oxidized surface is difficult to plate on. Due to different interactions that electroplating bath additives can have on metal oxide and pure metal, non-uniform plating may result. Further, the differences in conductivity between a metal oxide and a pure metal can exacerbate such non-uniformity.

Additionally, plating bulk metal on top of an oxidized surface can lead to adhesion or delamination problems, which can further lead to voids following subsequent processing steps, such as chemical mechanical planarization (CMP). Voids that result from etching, non-uniform plating, delamination, or other means may make the metal seed layer discontinuous, and unavailable to support plating.

In some cases, such oxidation, particularly from exposure to ambient, may be limited to a thin surface layer. Generally a metal seed layer in WLP processes is between about 1500-3000 Å thick. In various embodiments, the metal oxide may be avoided, minimized, or remedied through one or more changes to the processes shown in FIGS. 1A and 2. Minimization of oxide formation is beneficial in promoting high quality electroplating results and in creating WLP structures (e.g., pillars) that have optimum structural integrity. In some cases, the oxygen-based descumming operation may be replaced with a remote reducing plasma treatment. The reducing plasma treatment may involve exposure to a hydrogen-based plasma, though other types of reducing plasmas may be used, as well. In other cases, a remote reducing plasma treatment may follow an oxygen-based descumming operation. One or more of the oxygen-based descumming operation and the remote reducing plasma treatment may occur directly in a plasma treatment module or modules of a multi-tool electroplating apparatus. The disclosed reducing plasma treatments may also promote high quality electroplating results resulting from an improvement of the metal seed layer. For instance, the reducing plasma treatment may help reflow the metal seed to reduce voids and gaps in the metal seed layer. This reflow can mobilize the metal and redistribute atoms in the seed layer to improve seed coverage and/or smoothness, thereby forming a more uniform and continuous seed layer on which to plate.

Further, in some cases photoresist may be removed in the plasma treatment module of the electroplating apparatus after electroplating is complete. The removal may occur through exposure to an oxygen-based stripping plasma. The photoresist stripping operation may be followed by an additional remote reducing plasma treatment in the plasma treatment module. These operations, especially when performed in a multi-tool electroplating apparatus, minimize and counteract the impact of oxide formation and promote creation of structurally sound WLP structures.

Figure 4A:
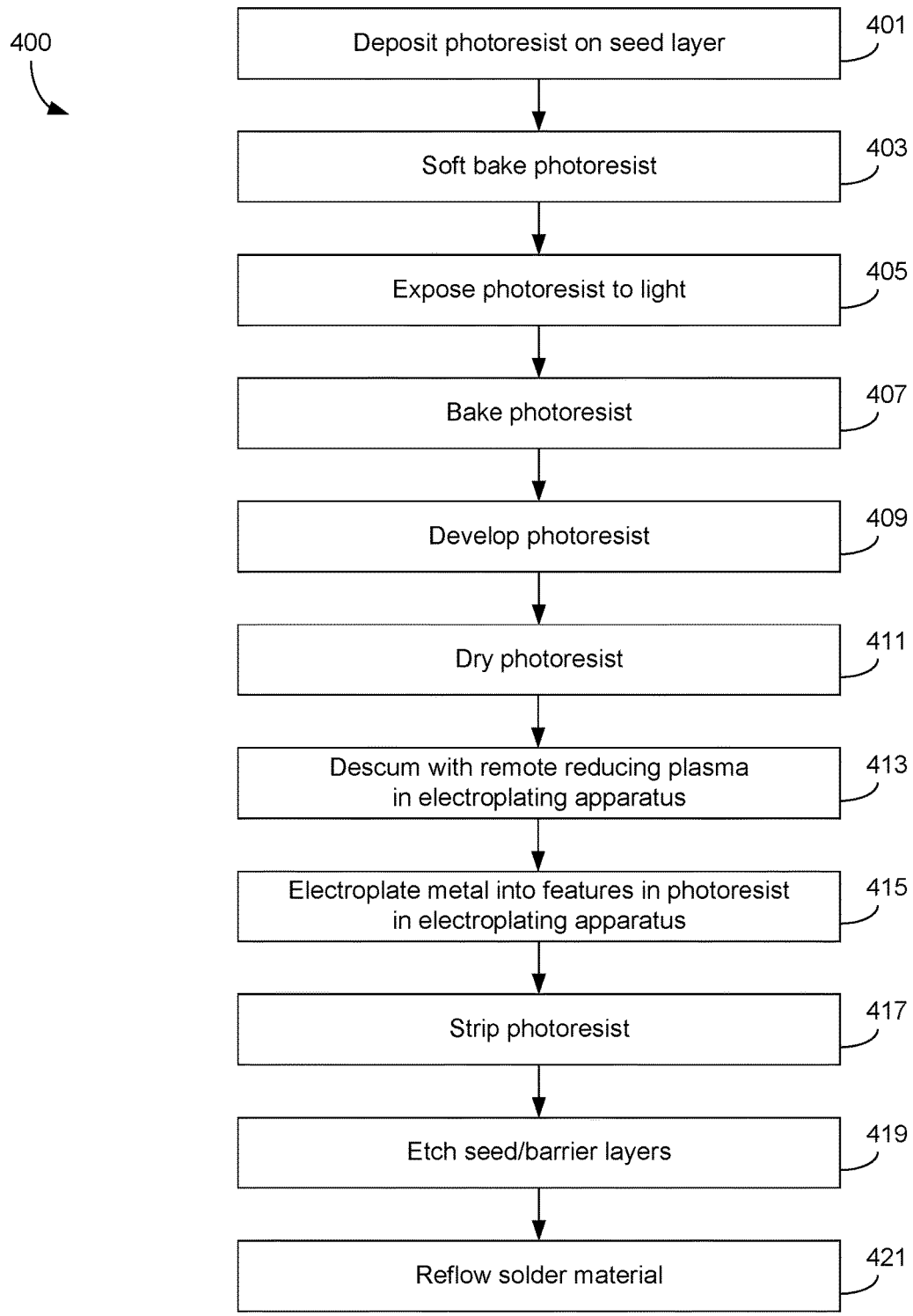
FIG. 4A is a flowchart for a method of performing WLP processes including a reducing plasma descumming treatment in place of an oxygen-based descumming treatment.

FIG. 4A provides a flowchart for an improved method of performing wafer level packaging processes in which the oxygen-based descumming operation is replaced with a remote reducing plasma treatment. Operations 401-411 correspond to operations 101-111 of FIG. 1A, and the discussion of these processes will not be reproduced here. The method 400 continues at operation 413, where the substrate is descummed through exposure to a remote reducing plasma. The reducing plasma is generated from a plasma generation gas. The plasma generation gas may include one or more of hydrogen ($H_2$), ammonia ($NH_3$), nitrogen ($N_2$), carbon monoxide (CO), diborane ($B_2H_6$), sulfite compounds, carbon and/or hydrocarbons, phosphites, and/or hydrazine ($N_2H_4$). In addition, the plasma generation gas may include one or more mixing gas species, such as relatively inert gas species. Examples of relatively inert gas species can include nitrogen ($N_2$), helium (He), neon (Ne), krypton (Kr), xenon (Xe), radon (Rn), and argon (Ar). The plasma generation gas may lack any oxidizing species. In a particular embodiment, the plasma generation gas is hydrogen with an optional mixing gas species. In another embodiment, the plasma generation gas is hydrogen with one or more of ammonia, nitrogen, carbon monoxide, diborane, sulfite compounds, carbon and/or hydrocarbons, phosphites, and hydrazine, optionally in combination with a mixing gas species.

In the embodiment of FIG. 4A, the substrate is descummed without exposing it to an oxygen-based or oxygen-containing plasma. Thus, the metal seed layer does not become oxidized during descumming. Details relating to the remote reducing plasma treatment and apparatus therefore are further discussed below. In various cases, the remote reducing plasma treatment occurs in a plasma treatment module that is incorporated into a multi-tool electroplating apparatus.

After the substrate is descummed in the reducing plasma, the method 400 continues by electroplating metal into the features in the photoresist at operation 415. Like operation 115 of FIG. 1A, operation 415 may include the method 200 shown in FIG. 2.

Figure 4B:
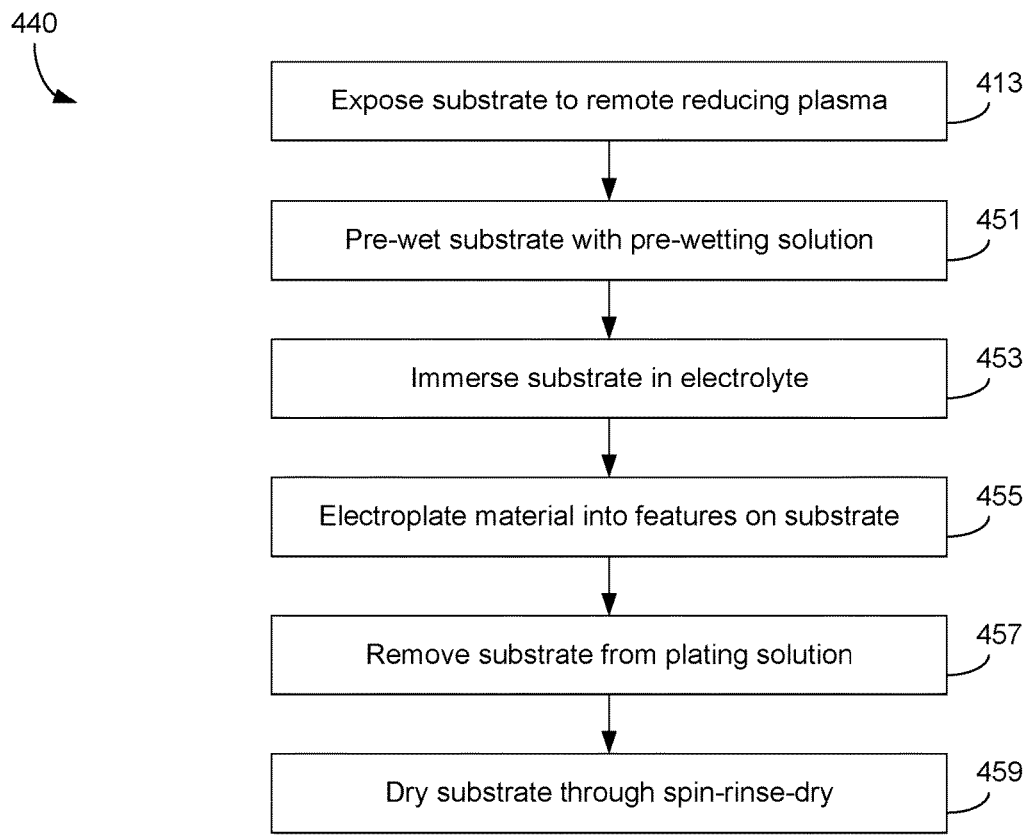
FIG. 4B is a flowchart further explaining certain portions of FIG. 1A that may occur within a multi-tool electroplating apparatus.

FIG. 4B is a flowchart further explaining certain portions of the method 400 of FIG. 4A. In particular, FIG. 4B describes the portion of method 400 that may occur in a multi-tool electroplating apparatus, and relates to operations 413 and 415 of FIG. 4A. As explained herein, a multi-tool electroplating apparatus may include a plasma treatment module. Note that the wet chemical operations related to electroplating overlap in FIGS. 2 and 4A. The method 440 begins at operation 413, where a substrate is exposed to a remote reducing (e.g., hydrogen-based) plasma to remove photoresist scum from the bottom of features etched in photoresist. This plasma treatment may occur in the plasma treatment module of the electroplating apparatus. The remote plasma treatment corresponds to operation 413 of FIG. 4A. Next, the substrate may be transferred from the plasma treatment module to an electroplating module within the multi-tool electroplating apparatus. The atmosphere exposed to the substrate during transfer may be substantially free of oxygen (e.g., only trace amounts of oxygen). In some cases, the atmosphere during transfer is a reducing atmosphere or an inert atmosphere. The atmosphere may also be at a low pressure, and in some cases may be under vacuum. After transfer to the electroplating module, the substrate may be pre-wet at operation 451 before being immersed in electrolyte at operation 453. Material is electroplated into features at operation 455 before the substrate is removed from electrolyte at operation 457. The substrate may then be moved to a spin-rinse-dry module where it is rinsed and dried at operation 459.

Returning to FIG. 4A, the method 400 continues with operations 417 (strip photoresist), 419 (etch seed/barrier layers) and 421 (reflow solder material). These operations correspond to operations 117, 119 and 121 of FIG. 1A and the discussion of these operations will not be repeated here.

Figure 4C:
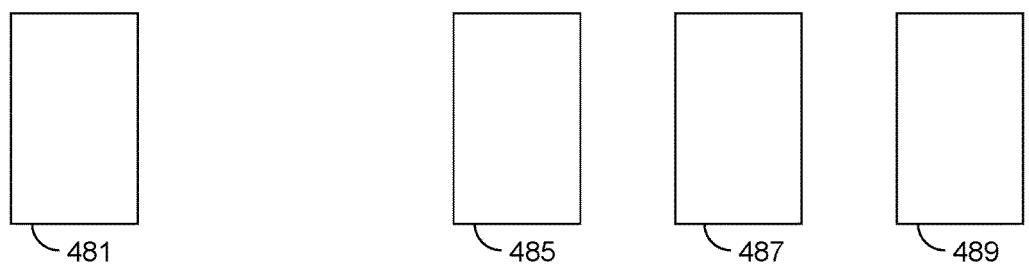
FIG. 4C schematically illustrates the various semiconductor processing apparatus used in practicing the method shown in FIGS. 4A and 4B.

FIG. 4C presents a schematic representation of the semiconductor processing apparatus used to practice the method 400 shown in FIG. 4A and further described in FIG. 4B. This figure is very similar to FIG. 3; however, because the method of FIGS. 4A and 4B does not include performing descumming in a standalone descumming tool, this apparatus (303 of FIG. 3) is omitted. Instead, the descumming operation 413 occurs in the electroplating module 485. All other processes may occur as described with relation to FIG. 3. For instance, operation 401 (deposit photoresist) may occur in spin coater 481, operations 403-411 may occur in lithography apparatus (not shown), the electroplating operation 415 (and 451-459) may occur in the multi-tool electroplating apparatus 485. Operations 417 (strip photoresist) and 419 (etch seed/barrier layers) may occur in a wet stripping apparatus 487. Solder may be reflowed at operation 421 in a reflow furnace or oven.

As explained further below, in some embodiments certain additional processes may take place in the multi-tool electroplating apparatus 485. For instance, where dry processing methods are used, the photoresist stripping operation 417 may be done in the disclosed plasma processing module of the electroplating apparatus 485. This operation may be followed by an additional hydrogen plasma treatment.

The process sequence shown in FIGS. 4A and 4B is advantageous for several reasons. First, the substrate experiences far less oxidation of the seed layer because the seed layer is not exposed to an oxygen-containing plasma during descumming. Further, oxidation of the seed layer is reduced because the substrate has a shorter distance to travel (and shorter queue time) immediately before electroplating occurs, since the descumming occurs in a portion of the electroplating apparatus, rather than in a standalone apparatus. In some cases, oxidation may be further reduced ensuring that the environment in which the substrate sits/travels after descumming and before electroplating contains minimal or no oxygen (e.g., through the use of a substantially oxygen-free environment within the electroplating apparatus, a load lock, reducing atmosphere, etc.). Because the seed layer does not become oxidized, the shape of the pillar formed after etching of the seed layer and barrier layer is not compromised. With reference to FIG. 1B, undercut 167 may be minimized or avoided altogether. This results in an improved WLP pillar having enhanced structural integrity.

Figure 5A:
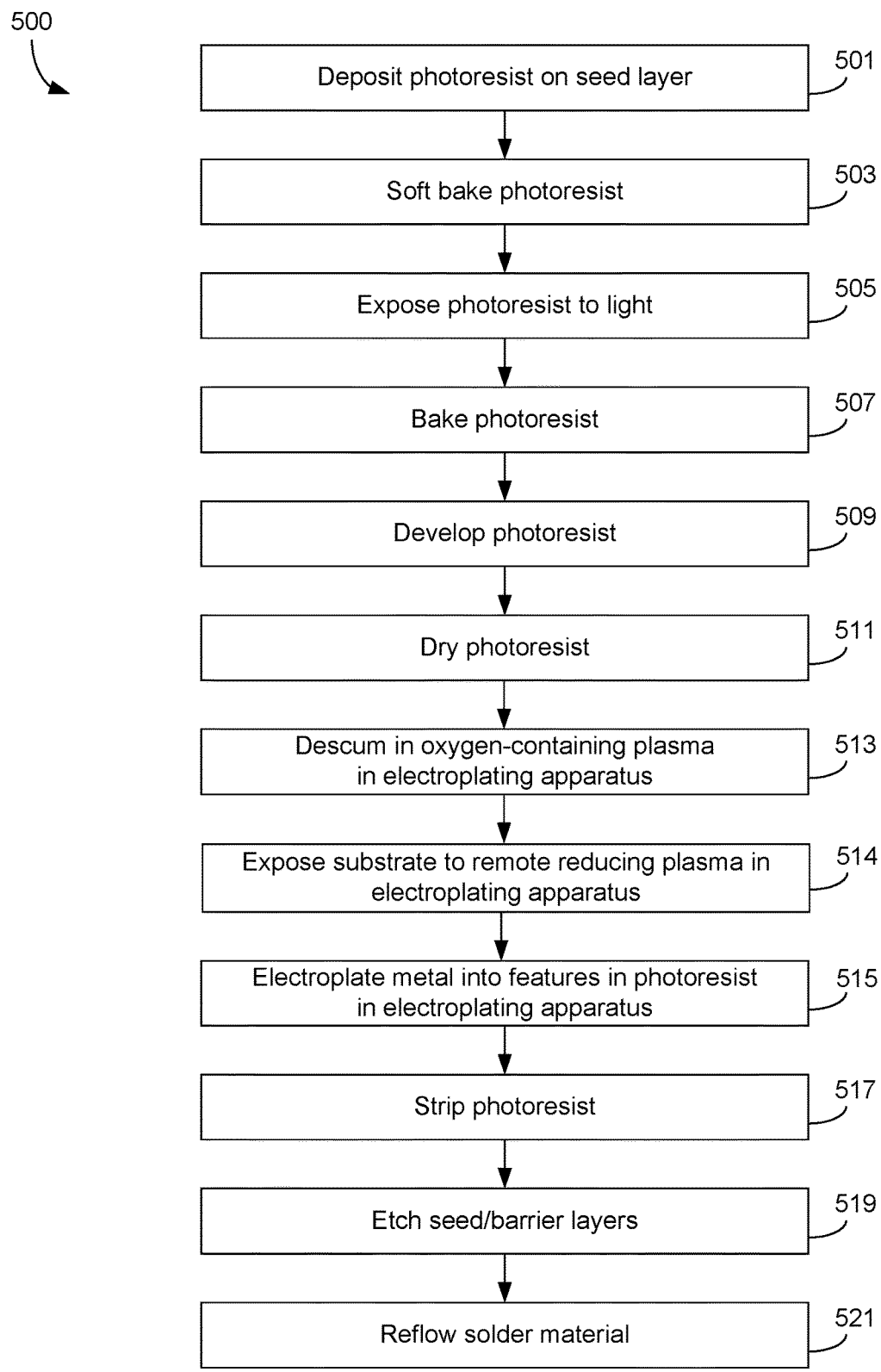
FIG. 5A is a flowchart for a method of performing WLP processes including both an oxygen-containing plasma descumming operation in addition to a reducing plasma treatment.
Figure 5B:
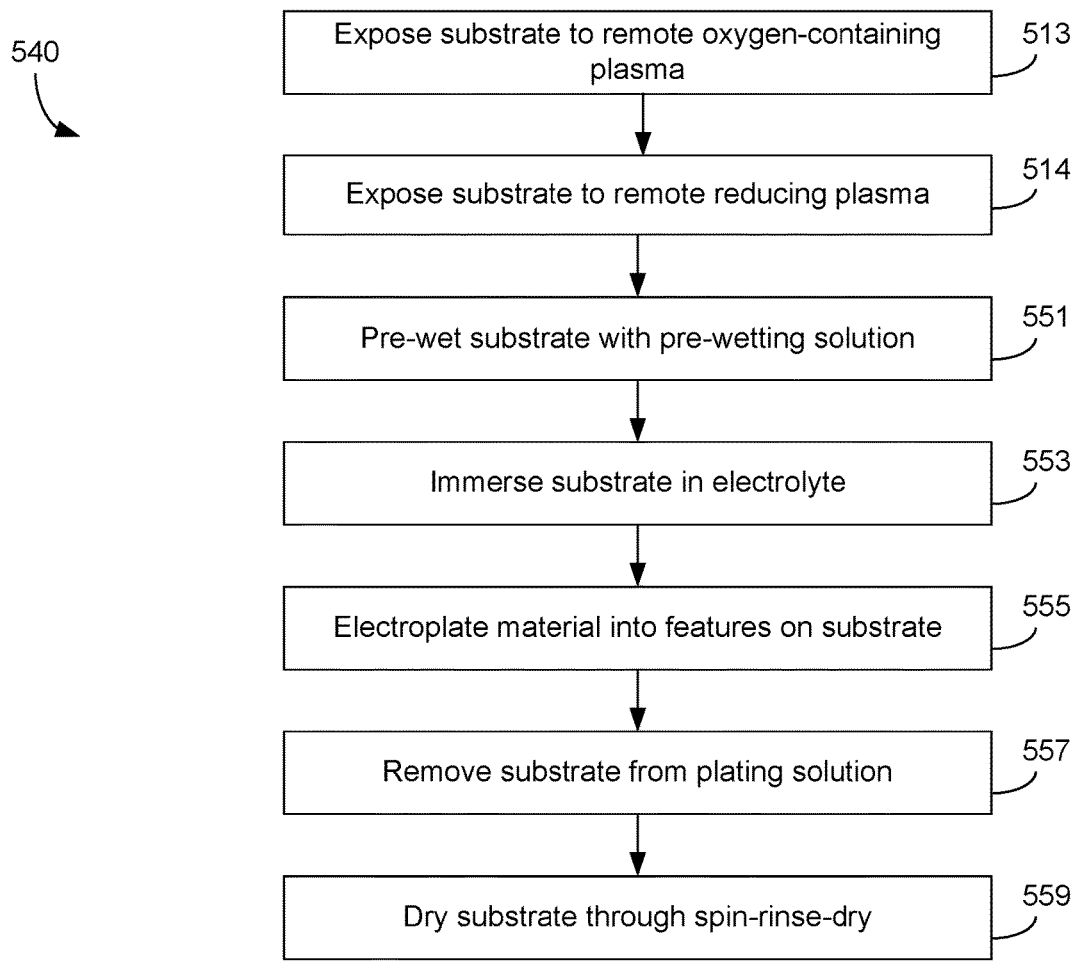
FIG. 5B is a flowchart further explaining portions of FIG. 5B that may occur in a multi-tool electroplating apparatus.

In another embodiment, descumming occurs through exposure to an oxygen-containing plasma followed by exposure to a remote reducing plasma. This embodiment is shown in FIGS. 5A and 5B. FIG. 5A lists various WLP processes that occur in this embodiment. FIG. 5B relates to and further describes the portions of FIG. 5A that occur in a multi-tool electroplating apparatus. In certain implementations, the reducing plasma may not be required to remove all of the photoresist scum. In these cases, an oxygen-containing plasma may be used to quickly remove all the scum before electroplating. However, as mentioned, exposure to an oxygen-containing plasma can oxidize the seed layer. Such oxidation may be remedied by exposing the substrate to a remote reducing plasma. The reducing plasma acts to reduce the oxidized material, thereby helping create/preserve a desired pillar shape after the seed and barrier layers are etched.

Operations 501-511 correspond to operations 101-111 of FIG. 1A. The method 500 continues at operation 513, where the substrate is descummed through exposure to an oxygen-containing plasma. The details of such a descumming operation are provided elsewhere herein. In this embodiment, the oxygen-based descumming occurs in a plasma treatment module of a multi-tool electroplating apparatus. The method continues with operation 514, where the substrate is exposed to a remote reducing plasma to thereby reduce any oxide present on the seed layer. This operation may occur in the plasma treatment module of the electroplating apparatus.

The remote plasma may generate radicals of the reducing gas species. The reducing gas species are species present in the plasma generation gas (before or after plasma activation) that cause materials to be reduced. Examples of reducing gas species include hydrogen, ammonia, hydrazine, etc. Radicals of the reducing gas species may include, for example, $H^*$, $NH_2^*$ and/or $N_2H_3^*$. The radicals of the reducing gas species react with the metal oxide surface to generate a pure metallic surface. As demonstrated below, Equation 3 shows an example a reducing gas species such as hydrogen gas being broken down into hydrogen radicals. Equation 4 shows the hydrogen radicals reacting with the metal oxide surface to convert the metal oxide to metal. For hydrogen gas molecules that are not broken down or hydrogen radicals that recombine to form hydrogen gas molecules, the hydrogen gas molecules can still serve as a reducing agent for converting the metal oxide to metal, as shown in Equation 5.

$$H_2 \rightarrow 2H^* \quad \text{Equation 3:}$$

$$(x)2H^* + MOx \rightarrow M + (x)H_2O \quad \text{Equation 4:}$$

$$xH_2 + MOx \rightarrow M + xH_2O \quad \text{Equation 5:}$$

The radicals of the reducing gas species, ions from the reducing gas species, ultraviolet (UV) radiation from the reducing gas species, or the reducing gas species itself may react with the metal oxide under conditions that convert the metal oxide to metal in the form of a film integrated with the metal seed layer.

The remote plasma may generate and include ions and other charged species of the reducing gas species. The ions and charged species of the reducing gas species may move to the surface of the substrate to react or otherwise contact the metal seed layer. The ions or charged species may freely drift toward the surface of the substrate or be accelerated toward the surface of the substrate when an oppositely charged bias is provided on a substrate support. The ions or charged species may react with the metal oxide to reduce the metal oxide. In some implementations, the ions or charged species in the remote plasma can include, for example, $H^+$, $NH_2^+$, $NH_3^+$, and $H^-$. Ions or charged species may be advantageous for reducing oxide on metal seed layers depending on a thickness and nature of the oxide layers, which can form on cobalt, ruthenium, palladium, rhodium, iridium, osmium, nickel, gold, silver, aluminum, tungsten, and alloys thereof. For example, the ions or charged species may be beneficial for treatment of a seed layer containing cobalt.

The remote plasma may also generate and include UV radiation from the reducing gas species. Excitation of the reducing gas molecules from the remote plasma may cause emission of photons. The emitted photons may lead to one of several effects. First, the emitted photons in the UV spectrum may heat the surface of the substrate to activate the metal oxide surface so that radicals, ions, and other charged species can more readily react with the metal oxide surface. Second, reducing gas species may absorb the emitted photons and generate radicals of the reducing gas species. The generated radicals may react with the metal oxide surface to reduce the metal oxide. Third, the emitted photon may have sufficient energy to cause reduction of the metal oxide itself.

In some implementations, the metal in the metal seed layer may be reflowed as a result of exposure to one or more of increased temperature, reduced pressure, UV radiation from a UV source, UV radiation from the remote plasma, and radicals, ions, and other charged species from the remote plasma. Such exposure can lead to atoms in the metal seed layer to enter a more excited state and become more mobile. The atoms can move around on an underlying layer to reduce voids/gaps. As a result, a more uniform and continuous metal seed layer can be created. In some implementations, the reflow and the reduction treatment can occur simultaneously.

Returning to FIGS. 5A and 5B, after the reducing plasma treatment in operation 514, the substrate may be moved to an electroplating module within the electroplating apparatus. The atmosphere exposed to the substrate during transfer may be a reducing atmosphere or an inert atmosphere. In some cases, the atmosphere during transfer may be substantially devoid of oxygen. Further, the atmosphere during transfer may be under low pressure, and in some cases is under vacuum. Electroplating operation 515 of FIG. 5A is further described with relation to operations 551-559 of FIG. 5B (which also correspond to operations 201-209 of FIG. 2). Because these operations have been described above, the description will not be reproduced here. Next, the process continues with operations 517 (strip photoresist), 519 (etch seed/barrier layers) and 521 (reflow solder material). These operations correspond to operations 117, 119 and 121 of FIG. 1A, and are described above.

Like the method shown in FIGS. 4A and 4B, the method shown in FIGS. 5A and 5B may be practiced on the apparatus shown in FIG. 4C. As mentioned, both plasma exposure operations 513 and 514, as well as the electroplating operations 515 (operations 551-559) may occur in the multi-tool electroplating apparatus 485.

Figure 6A:
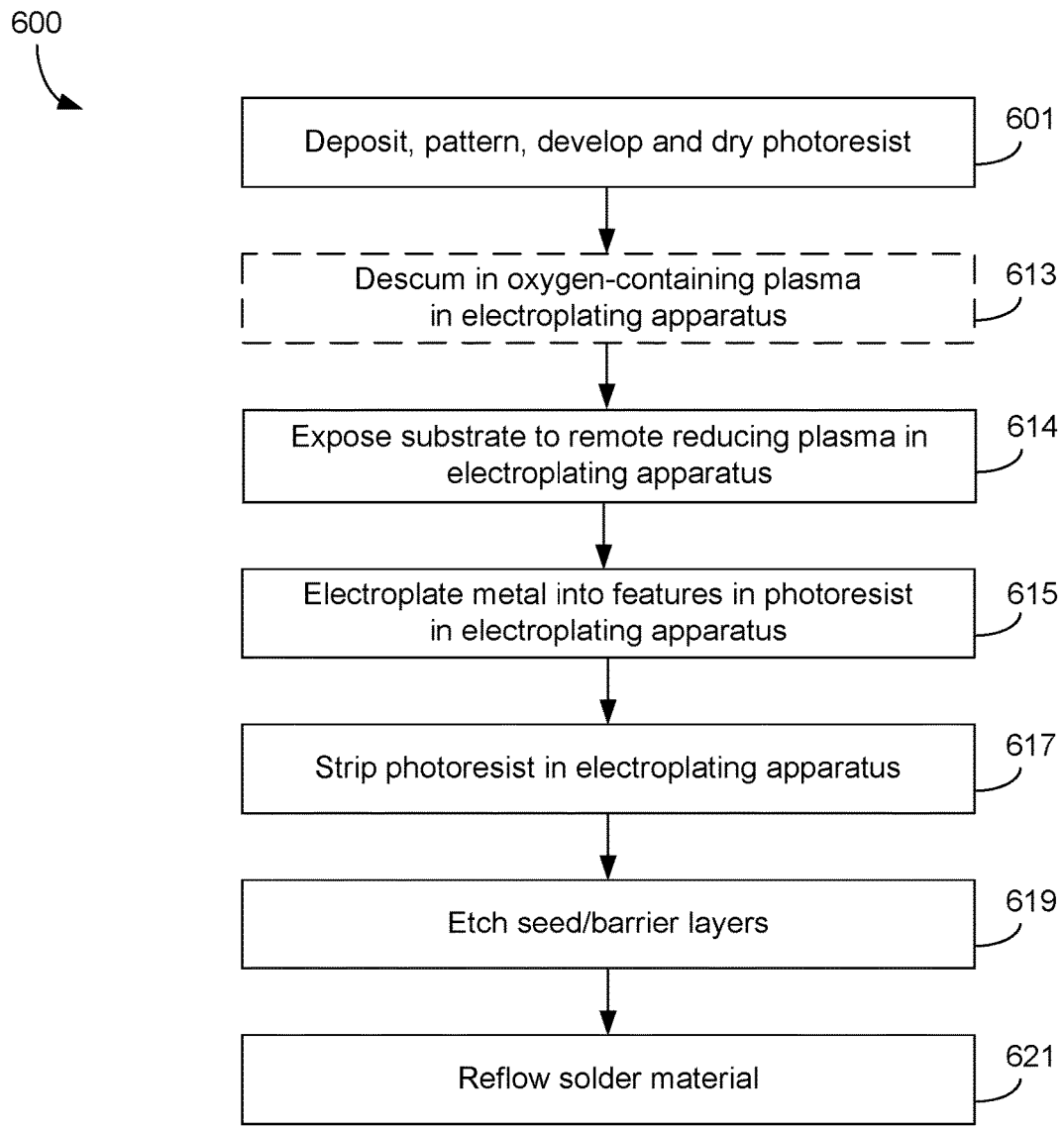
FIG. 6A is a flowchart illustrating a method of performing WLP processes including an optional oxygen-containing plasma descum operation, a reducing plasma treatment, and a photoresist strip operation that may all take place in a multi-tool electroplating apparatus.
Figure 6B:
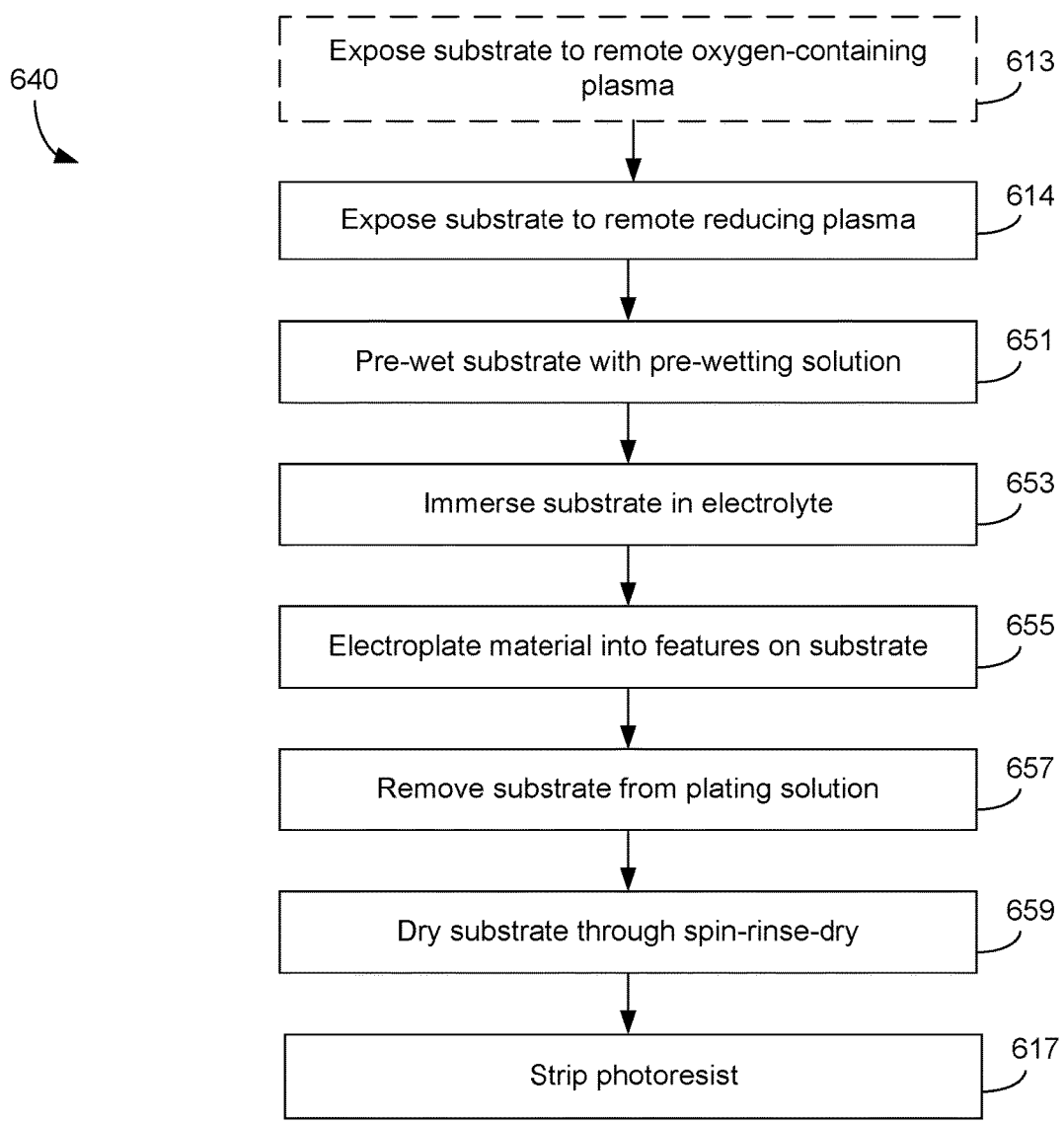
FIG. 6B is a flowchart further explaining portions of FIG. 6A that occur in an electroplating apparatus.

In some other embodiments, the plasma treatment module of the multi-tool electroplating apparatus may be used for additional purposes after metal is electroplated into the features in the photoresist. One such purpose may be to strip the photoresist from the substrate after electroplating. FIGS. 6A and 6B provide flowcharts for a method of performing WLP processes in accordance with this embodiment. The method 640 of FIG. 6B pertains to and further clarifies the portions of FIG. 6A that occur in the multi-tool electroplating apparatus. The method 600 begins at operation 601, where photoresist is deposited, patterned, developed and dried. Operation 601 corresponds to operations 101-111 of FIG. 1A. Next, the substrate may be transferred to a plasma treatment module of a multi-tool electroplating apparatus. Here, the substrate may be optionally exposed to an oxygen-based descumming treatment in operation 613. In some embodiments this oxygen-based exposure 613 may be omitted. Next, the substrate may be exposed to a reducing plasma treatment in operation 614. Where this reducing plasma treatment 614 follows an oxygen-based descumming treatment 613, the primary purpose of reducing plasma exposure may be to reduce any oxides present on the seed layer. Where the oxygen-based plasma treatment 613 is omitted, the primary purpose of the reducing plasma treatment 614 may be to remove photoresist scum from the seed layer. The method continues by transferring the substrate from the plasma treatment module to an electroplating module within the electroplating apparatus. The substrate can then be electroplated. This may include pre-wetting the substrate 651, immersing the substrate in electrolyte 653, electroplating material into the features 655, removing the substrate from solution 657 and drying the substrate through spin-rinse-dry 659. Operations 651-659 correspond to operations 201-209 of FIG. 2. After electroplating, the substrate may be transferred back to a plasma treatment module for further plasma processing. In the example shown in FIGS. 6A and 6B, this further processing includes stripping the photoresist from the substrate in operation 617. In various embodiments, this is accomplished by exposing the substrate to a remote or in situ plasma that includes stripping chemistry, for example the stripping plasma may include oxygen ($O_2$), optionally in combination with hydrogen (H2) and/or a weak oxidizing agent such as carbon dioxide. Further details of such a photoresist stripping method are discussed below.

Figure 7A:
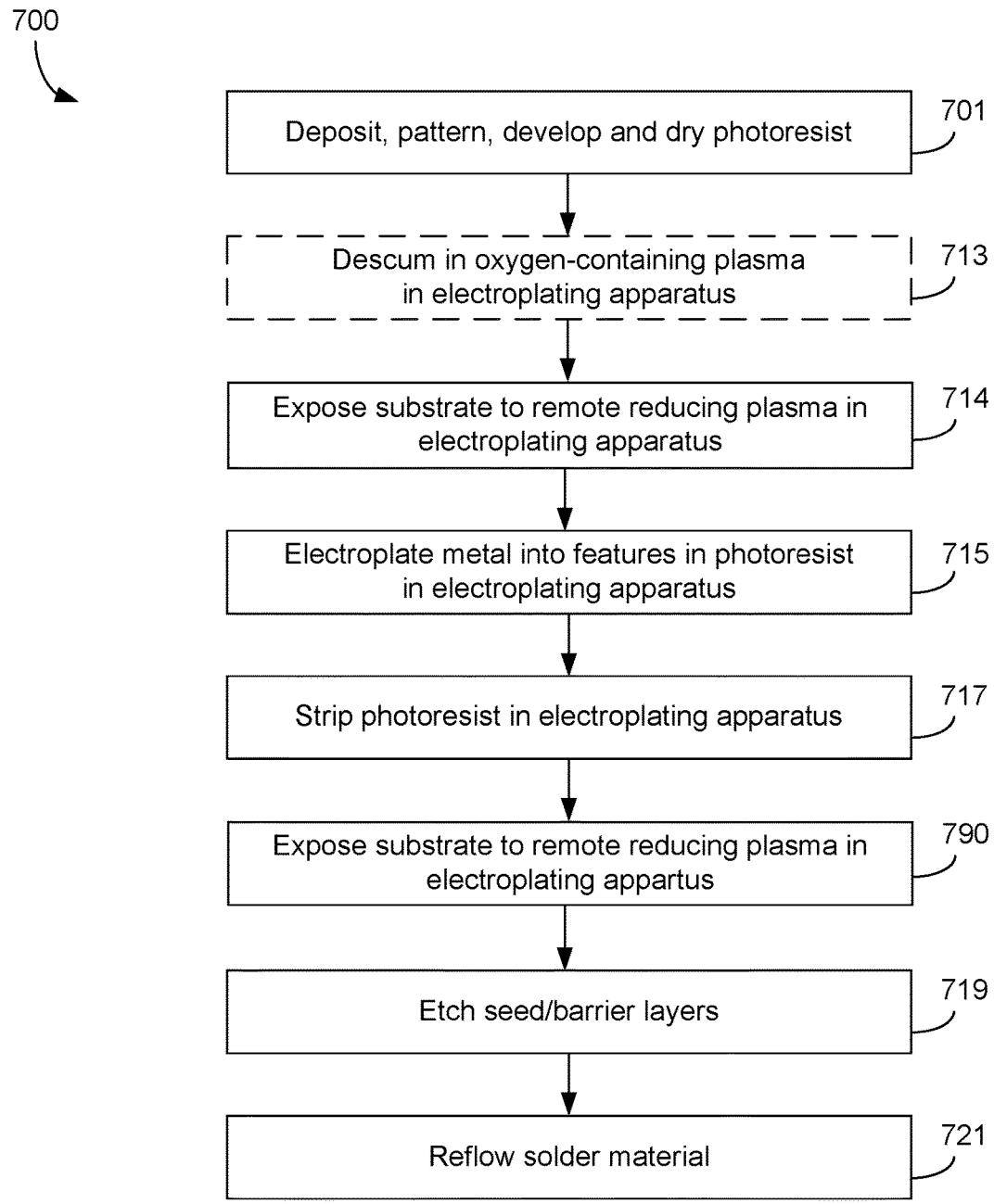
FIG. 7A is a flowchart illustrating the method of FIG. 6A and further including an additional reducing plasma treatment after the photoresist stripping operation.
Figure 7B:
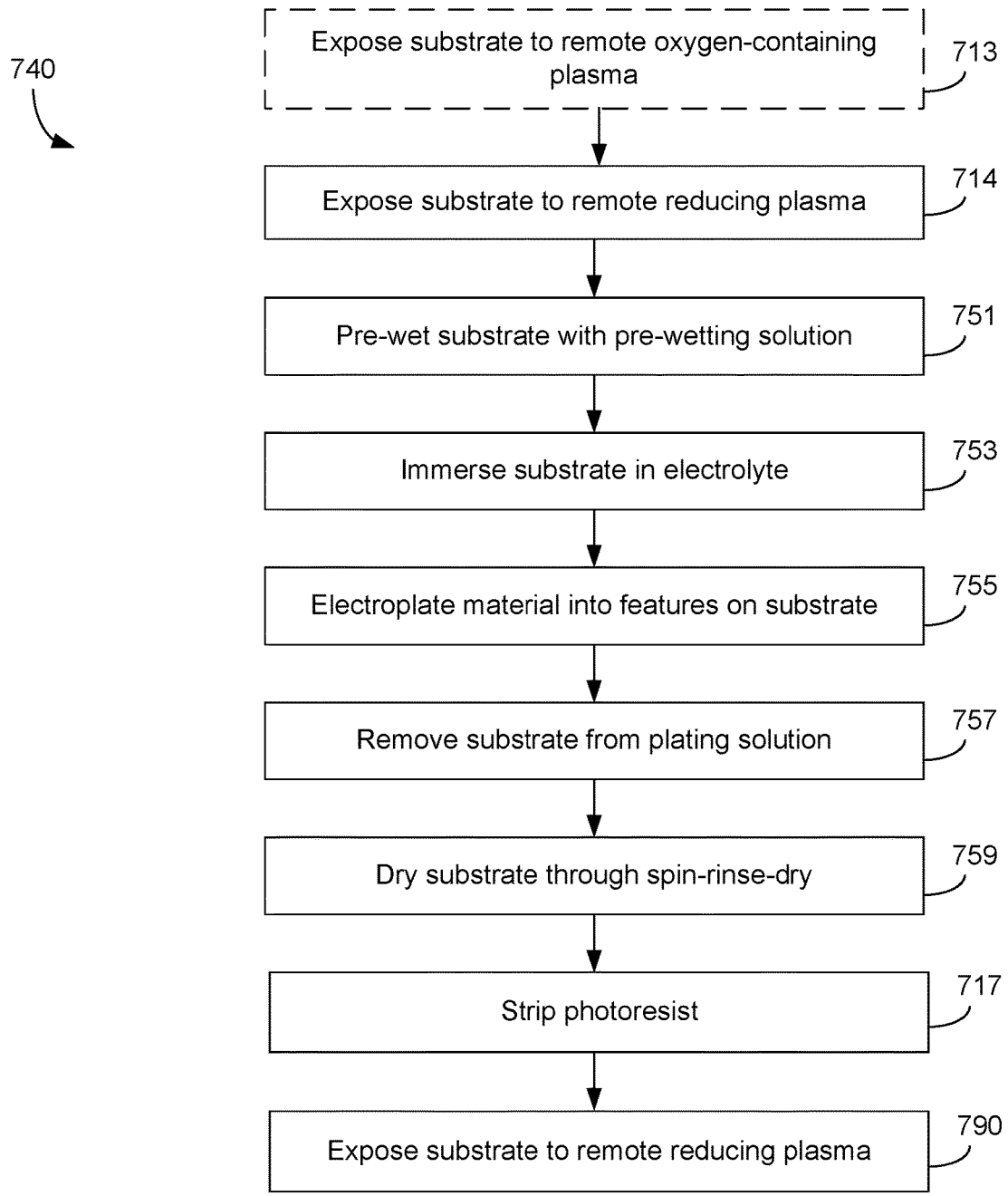
FIG. 7B is a flowchart further describing certain portions of FIG. 7A that may occur in an electroplating apparatus.

In another embodiment, an additional plasma treatment may be undertaken in the plasma treatment module of the electroplating apparatus after the photoresist is stripped from the substrate. This embodiment is shown in FIGS. 7A and 7B. The bulk of this embodiment is identical to that shown in FIGS. 6A and 6B, and the description will not be repeated. For instance, operations 701-721 correspond to operations 601-621, and operations 751-759 correspond to operations 651-659. However, the embodiment of FIGS. 7A and 7B includes an additional remote reducing plasma treatment 790 (in some cases a hydrogen plasma treatment) that may occur in a plasma treatment module of the electroplating apparatus. The additional treatment 790 may occur after the resist is stripped in 717 and before the seed and barrier layers are etched in 719. This additional remote reducing plasma treatment 790 may help to reduce any oxides formed during the photoresist strip operation. Processing details provided in relation to the reducing plasma treatment that occurs after oxygen-based descumming also apply to the reducing plasma treatment that occurs after photoresist stripping.

Oxygen-Containing Plasma Treatment for Descumming Substrate

An oxygen-containing plasma treatment may be beneficial, particularly where the photoresist is difficult or slow to adequately remove with a reducing plasma treatment alone. These may also be cases where the photoresist is difficult to remove with a wet stripping operation. In general, the purpose of this oxygen-containing plasma exposure is to remove photoresist scum from the bottom of the etched features in the photoresist to leave a scum-free seed layer exposed.

In various examples, the gas used to generate the plasma (i.e., the plasma generation gas) may be at least about 30% oxygen by volume, or at least about 40% oxygen by volume (as measured in sccm). In these or other cases, the plasma generation gas may include about 70% or less oxygen by volume, for example about 60% or less oxygen by volume. In various embodiments, the gas used to generate the plasma is about 50% oxygen by volume. The plasma generation gas may also include a relatively inert gas species such as nitrogen ($N_2$), helium (He), neon (Ne), krypton (Kr), xenon (Xe), radon (Rn), and argon (Ar). In some cases, an additional component may be included, as well. In one example, $CF_4$ is provided at a low rate (e.g., between about 25-100 sccm) along with oxygen and nitrogen (each provided at between about 4,000-6,000 sccm). The total flow rate of plasma generation gas may be between about 500-30,000 sccm, for example between about 8,000-12,000 sccm, based on a 300 mm wafer. The pressure within the processing chamber may be between about 30-100 Torr, for example between about 50-70 Torr. The temperature of the substrate may be maintained between about 80-150° C., for example between about 100-110° C. The substrate should be maintained below a temperature at which the seed layer is likely to agglomerate, which may be as low as about 160-180° C. in certain cases. The temperature of the reaction chamber may be between about 80-150° C. The power used to generate the plasma may be between about 400-800 W/station, for example about 600 W/station. The duration of plasma exposure may be on the order of a few minutes or less, in various cases less than about 1 minute. These processing details are intended to be illustrative and not limiting.

In certain embodiments, the oxygen-containing plasma treatment for descumming the substrate occurs in a plasma treatment module incorporated into a multi-tool electroplating apparatus.

Oxygen-Containing Plasma Treatment for Stripping Photoresist

An oxygen-containing plasma treatment may be used to strip the photoresist off the substrate after metal is electroplated into the photoresist features. This stripping operation may occur in a plasma treatment module of a multi-tool electroplating apparatus.

The plasma generation gas for this process may include oxygen. The plasma generation gas may also include an etchant (e.g., a fluorine-containing component in some cases) and a relatively inert gas species. The total flow rate of plasma generation gas may be between about 500-30,000 sccm, for example between about 5,000-15,00 sccm, based on a 300 mm wafer. The pressure within the processing chamber may be between about 0.5-10 Torr, for example between about 0.5-6 Torr. The temperature of the substrate may be maintained between about 0-400° C., for example between about 5-250° C., or between about 5-150° C. The power used to generate the plasma may be between about 5000-6,000 W/station. The duration of plasma exposure may be between about 0.5-3 minutes, for example between about 1-2 minutes. These processing details are intended to be illustrative and not limiting.

Reducing Plasma Treatment for Descumming Substrate

In various embodiments, the oxygen-based descumming process may be replaced by a reducing plasma descumming process. This reducing plasma process may occur in a plasma treatment module of an electroplating apparatus. The reducing plasma process is advantageous for the reasons discussed above, particularly the fact that this process results in WLP structures having improved structural integrity. However, one reason that reducing plasma descumming may have been avoided in the past is that the oxygen-based descumming works very well to quickly remove the scum. In comparison, reducing plasma (e.g., hydrogen-based plasma) descumming is generally slower/less efficient. Thus, without the recognition that the oxidation resulting from the oxygen-based descumming operation can cause an excessive undercut in a WLP pillar after etching the seed/barrier layers, there would be no reason to use the less efficient reducing plasma descumming process.

In certain embodiments, the gas used to generate the plasma (i.e., the plasma generation gas) includes one or more of hydrogen, ammonia ($NH_3$), nitrogen ($N_2$), carbon monoxide (CO), diborane ($B_2H_6$), sulfite compounds, carbon and/or hydrocarbons, phosphites, and hydrazine ($N_2H_4$), and one or more relatively inert gas species. The total flow rate of plasma generation gas may be between about 500-30,000 sccm, for example between about 5,000-15,000 sccm, based on a 300 mm wafer. The power used to generate the plasma may be between about 500-6,000 W/station. The frequency used to generate the plasma may be 13.56 MHz.

The duration of exposure to the reducing gas plasma can vary depending on the other process parameters. For example, the duration of exposure to the reducing gas plasma can be shortened by increasing remote plasma power, temperature of the reducing chamber, etc. In certain embodiments, the duration of the exposure can be between about 1 second and about 60 minutes. For example, for descumming copper seed layers where no oxygen descumming is used previously, the duration of the exposure can between about 10-60 seconds, for example about 30 seconds.

The substrate should be maintained a sufficiently low temperature such that the seed layer does not begin to agglomerate. Agglomeration includes any coalescing or beading of a continuous or semi-continuous metal seed layer into beads, bumps, islands, or other masses to form a discontinuous metal seed layer. This can cause the metal seed layer to peel away from the surface upon which it is disposed and can lead to increased voiding during plating. Seed agglomeration has been observed at temperatures as low as about 160-180° C. in the WLP context. Further, high temperatures can present a problem to the photoresist. For instance, at temperatures above about 200° C., the photoresist can become charred, which may result in delamination of the resist, increased variability in feature sizes, and other related problems. As such, in some embodiments the substrate is maintained at a temperature below about 150° C., for example below about 120° C., or below about 100° C. In these or other cases, the substrate may be maintained at a temperature of at least about −10° C.

In some embodiments, the temperature of the plasma treatment chamber can be relatively high to permit the dissociation of reducing gas species into radicals. For example, the chamber can be anywhere between about 10° C. and about 500° C., such as between about 50° C. and about 250° C. Higher temperatures may be used to speed up metal oxide reduction reactions and shorten the duration of exposure to the reducing gas atmosphere. In some embodiments, the reducing chamber can have a relatively low pressure to substantially remove any oxygen from the reducing gas atmosphere, as minimizing the presence of oxygen in the atmosphere can reduce the effects of reoxidation. For example, the reducing chamber can be pumped down to a vacuum environment or a reduced pressure of between about 0.1 Torr and about 50 Torr. The increased temperature and/or the reduced pressure can also increase reflow of metal atoms in the metal seed layer to create a more uniform and continuous metal seed layer.

In order to control the temperature of the substrate such that it is lower than the temperature within the plasma treatment chamber/module, a cooling system such as an actively cooled pedestal and/or gas flow cooling apparatus in the plasma treatment chamber can be used to keep the local area of the substrate at temperatures below the agglomeration temperature. In some embodiments, the substrate may be supported upon and directly in contact with the pedestal. In some embodiments, a gap may exist between the pedestal and the substrate. Heat transfer can occur via conduction, convection, radiation, or combinations thereof.

In some implementations, an actively cooled pedestal provides a heat transfer element with resistive heating elements, cooling channels, or other heat sources or sinks embedded within the pedestal. For example, the pedestal can include cooling elements that permit a fluid such as water to circulate within the pedestal and actively cool the pedestal. In some embodiments, the cooling elements can be located outside the pedestal. In some embodiments, the cooling fluid can include a low-boiling fluid, such as glycols. Embodiments that include such cooling elements can be described in U.S. Pat. No. 7,327,948; U.S. Pat. No. 7,941,039; U.S. patent application Ser. No. 11/751,584, filed May 21, 2007, and titled "CAST PEDESTAL WITH HEATING ELEMENT AND COAXIAL HEAT EXCHANGER"; U.S. patent application Ser. No. 13/370,579, filed Feb. 10, 2012, and titled "SINGLE-CHAMBER SEQUENTIAL CURING OF SEMICONDUCTOR WAFERS"; and U.S. Pat. No. 8,137,465, each of which are incorporated herein by reference in its entirety and for all purposes. Temperature in the pedestal can be actively controlled using a feedback loop.

In some implementations, a gap can exist between the pedestal and the substrate, and a conductive media such as gas can be introduced between the pedestal and the substrate to cool the substrate. In some embodiments, the conductive media can include helium. In some embodiments, the pedestal can be convex or concave to promote uniform cooling across the substrate. Examples of pedestal profiles can be described in U.S. patent application Ser. No. 11/129,266, filed May 12, 2005, and titled "TAILORED PROFILE PEDESTAL FOR THERMO-ELASTICALLY STABLE COOLING OR HEATING OF SUBSTRATES"; U.S. patent application Ser. No. 11/546,189, filed Oct. 10, 2006, and titled "CONCAVE PEDESTAL FOR UNIFORM HEATING OF SILICON WAFERS"; and U.S. patent application Ser. No. 12/749,170, filed Mar. 29, 2010, and titled "TAILORED PROFILE PEDESTAL FOR THERMO-ELASTICALLY STABLE COOLING OR HEATING OF SUBSTRATES," each of which is incorporated herein by reference in its entirety and for all purposes.

Different configurations can be utilized to efficiently cool and to maintain a substantially uniform temperature across the substrate. Some implementations of an active cooling system include a pedestal circulating water within the pedestal coupled with a uniform gas flow across the substrate. Other implementations include a pedestal resistively heated coupled with a uniform gas flow across the substrate. Other configurations and/or additions may also be provided with the active cooling system. For example, a removable ceramic cover can be inserted between the pedestal and the substrate to promote substantially uniform temperature across the substrate, as described in U.S. Pat. No. 8,371,567, which is incorporated herein by reference in its entirety and for all purposes. In some embodiments, gas flow can be controlled with minimum contact supports to rapidly and uniformly cool the substrate, as described in U.S. Pat. No. 8,033,771, which is incorporated herein by reference in its entirety and for all purposes. In some embodiments, the heat transfer coefficient of the conductive media can be adjusted by varying the partial pressure of the conductive media as described in U.S. Pat. No. 8,288,288, which is incorporated herein by reference in its entirety and for all purposes. Other configurations for a localized cooling system for maintaining a relatively low substrate temperature can be utilized as is known in the art.

The temperature of the substrate can be maintained at a temperature below the agglomeration temperature of the metal using any of the cooling systems discussed earlier herein or as is known in the art. In some embodiments, the substrate can be maintained at a temperature between about −10° C. and about 150° C. In copper seed layers, for example, the substrate may be maintained at a temperature between about 75° C. and about 100° C. In cobalt seed layers, the substrate may be maintained at a temperature greater than about 100° C. The temperature management discussed herein is applicable to any of the disclosed plasma processes (e.g., oxygen-based processes and reducing gas-based processes, both before and after electroplating occurs).

Reducing Plasma Treatment for Reducing Oxides after an Oxygen-Based Descumming Treatment or after Oxygen-Based Photoresist Stripping This reducing plasma treatment may occur after an oxygen-containing descumming operation, and may take place in a plasma treatment module of an electroplating apparatus. The purpose of this treatment may be to reduce any oxides present on a metal seed layer, for example oxides that formed during descumming with oxygen.

In certain embodiments, the gas used to generate the plasma (i.e., the plasma generation gas) includes one or more of hydrogen ($H_2$), ammonia ($NH_3$), nitrogen ($N_2$), carbon monoxide (CO), diborane ($B_2H_6$), sulfite compounds, carbon and/or hydrocarbons, phosphites, and hydrazine ($N_2H_4$), and one or more relatively inert gas species. The total flow rate of plasma generation gas may be between about 500-30,000 sccm, for example between about 5,000-15,000 sccm, based on a 300 mm wafer. The power used to generate the plasma may be between about 500-6,000 W/station. The pressure within the processing chamber may be between about 30-100 Torr, for example between about 50-70 Torr. In other cases, the pressure may be lower, for example between about 0.5-30 Torr, for example between about 0.5-6 Torr. The temperature of the substrate may be maintained between about 80-150° C., for example between about 100-110° C. for the reducing plasma treatment that occurs after oxygen-based descumming. Higher temperatures (e.g., between about 0-400° C.) may be used for the reducing plasma treatment for reducing oxides after an oxygen-based photoresist stripping operation. With the photoresist gone and electroplating on the seed layer complete, there is less concern about high temperature processing potentially damaging photoresist or a seed layer. The power used to generate the plasma may be between about 400-6,000 W/station, in some cases between about 400-800 W/station, for example about 600 W/station. These processing details are intended to be illustrative and not limiting.

Alternative Plasma Treatments

In some embodiments, one or more of the reducing plasma treatments shown in FIGS. 4A, 4B, 5A, 5B, 6A, 6B, 7A and 7B may be replaced with an alternative plasma treatment. The alternative plasma treatment may involve exposure to a plasma that is relatively gentle such that the plasma does not cause damage to the substrate. The plasma generation gas (and therefore the plasma) in this case may include species that are neither oxidizing nor reducing.

Apparatus

A remote plasma treatment module for treating a substrate with a metal seed layer is disclosed. The plasma treatment module may be incorporated into a multi-tool electroplating apparatus. The plasma treatment module may be used for one or more of the disclosed plasma treatments. In some cases, a single plasma treatment module may be used to perform the oxygen-based descumming as well as the oxygen-based photoresist stripping. The plasma treatment module may further be used to perform the reducing plasma exposure operations. However, in some embodiments a first plasma treatment module may be provided for processing the substrate in oxygen-based or oxygen-containing plasmas, and a second plasma treatment module may be provided for processing the substrate in reducing plasmas. In other cases, each process has a dedicated plasma treatment module.

The remote plasma module includes a processing chamber, a substrate support for holding the substrate in the processing chamber, a remote plasma source over the substrate support, a showerhead between the remote plasma source and the substrate support, one or more movable members in the processing chamber, and a controller. The one or more movable members may be configured to move the substrate to positions between the showerhead and the substrate support. The controller may be configured to perform one or more operations, including providing the substrate in the processing chamber, moving the substrate towards the substrate support, forming a remote plasma of a reducing gas species in the remote plasma source where the remote plasma includes radicals of the reducing gas species, exposing the metal seed layer of the substrate to the radicals of the reducing gas species, and exposing the substrate to an inert gas.

The remote plasma module can be configured to perform a plurality of operations not limited to treating a substrate with a remote plasma. The remote plasma module can be configured to transfer (such as load/unload) a substrate efficiently to/from/within an electroplating apparatus, electroless plating apparatus, or other metal deposition apparatus. The remote plasma module can be configured to efficiently control the temperature of the substrate by positioning the substrate using movable members and/or the using substrate support. The remote plasma module can be configured to efficiently control the temperature of the substrate by controlling the temperature of the substrate support and the temperature of the showerhead. The remote plasma module can be configured to tune the rate of reduction reaction and the uniformity of the reduction reaction by positioning the substrate support relative to the showerhead. The remote plasma module can be configured to control the environmental conditions surrounding the substrate by controlling the gases and flow rates of the gases delivered into the processing chamber. Such operations can improve the processing of the substrate while also integrating additional operations into a single module. Thus, a single treatment module can be used for treating and cooling the substrate, rather than using two separate modules. Furthermore, by configuring the remote plasma module to be able to perform some of the operations described above, the remote plasma module can reduce potential oxidation of the metal seed layer before, during, and after processing of the substrate.

In some implementations, the remote plasma module can include a processing chamber, a substrate support for holding a substrate having a metal seed layer in the processing chamber, a remote plasma source over the substrate support, a showerhead between the remote plasma source and the substrate support, and a controller. The controller may be configured to perform one or more operations, including providing the substrate with the metal seed layer in the processing chamber (where a portion of the metal seed layer has been converted to oxide of the metal, in certain cases), forming a remote plasma in the remote plasma source, where the remote plasma includes one or more of: radicals, ions, and UV radiation from the reducing gas species, and exposing the metal seed layer of the substrate to the remote plasma, where exposure reduces any metal oxide and reflows the metal in the metal seed layer.

In some implementations, the remote plasma apparatus can further include a UV source. The UV source can include UV broadband lamps such as mercury lamps, UV excimer lamps, UV excimer lasers, and other appropriate UV sources. Aspects of the UV source can be described in U.S. patent application Ser. No. 13/787,499, filed Mar. 6, 2013, and titled "METHODS FOR REDUCING METAL OXIDE SURFACES TO MODIFIED METAL SURFACES USING A GASEOUS REDUCING ENVIRONMENT," which is incorporated herein by reference in its entirety and for all purposes. In some implementations, the reducing gas species can be exposed to UV radiation from the UV source to form radicals and other charged species of the reducing gas species, which can react with a metal oxide surface of a metal seed layer to reduce metal oxide.

Figure 8:
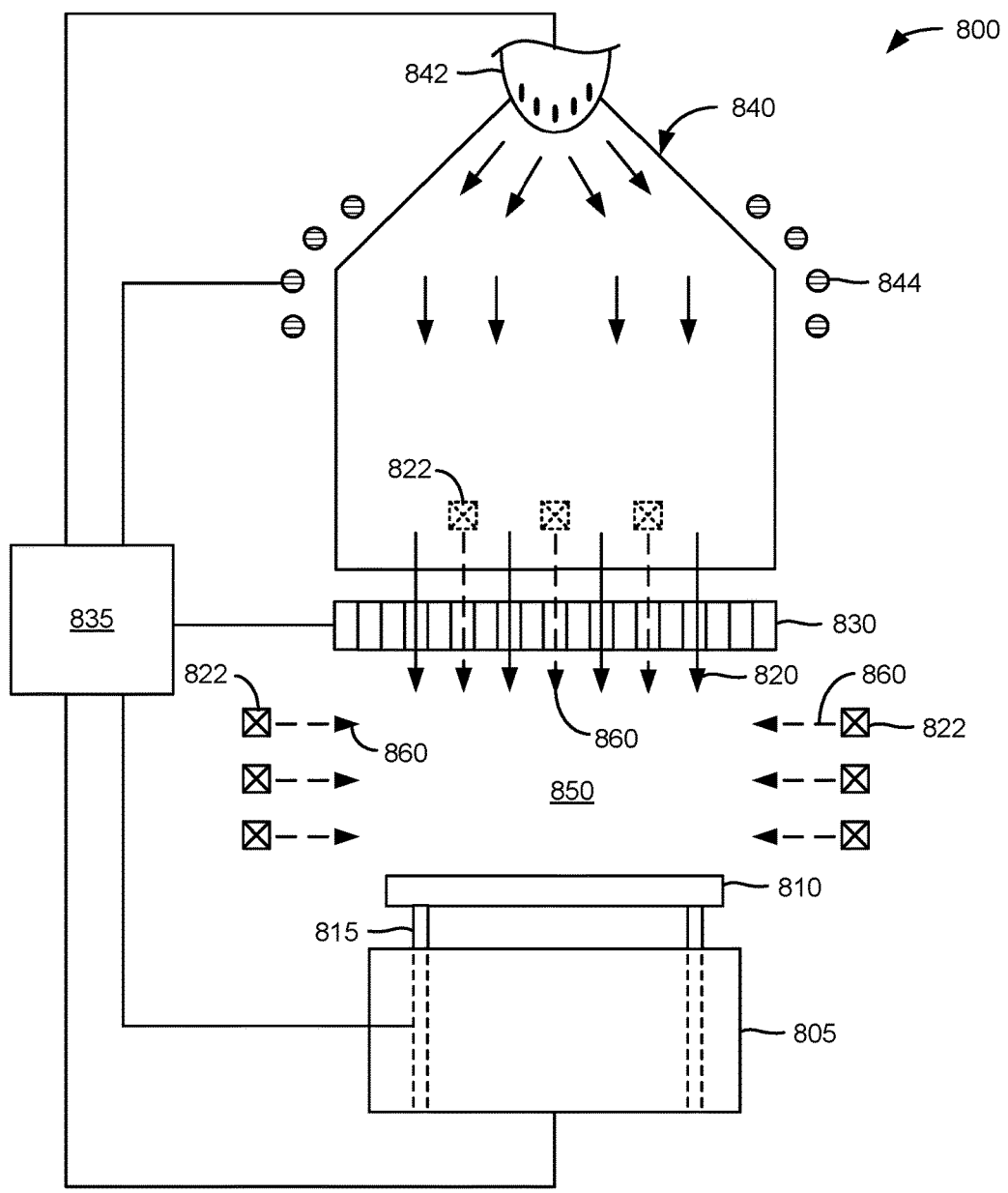
FIG. 8 shows a representation of a plasma treatment module.

FIG. 8 shows an example of a cross-sectional schematic diagram of a remote plasma module with a processing chamber. The remote plasma apparatus 800 includes a processing chamber 850, which includes a substrate support 805 such as a pedestal, for supporting a substrate 810. The remote plasma module 800 also includes a remote plasma source 840 over the substrate 810, and a showerhead 830 between the substrate 810 and the remote plasma source 840. A reducing gas species 820 can flow from the remote plasma source 840 towards the substrate 810 through the showerhead 830. A remote plasma may be generated in the remote plasma source 840 to produce radicals of the reducing gas species 820. The remote plasma may also produce ions and other charged species of the reducing gas species. The remote plasma may further generate photons, such as UV radiation, from the reducing gas species. For example, coils 844 may surround the walls of the remote plasma source 840 and generate a remote plasma in the remote plasma source 840.

In some embodiments, the coils 844 may be in electrical communication with a radio frequency (RF) power source or microwave power source. An example of a remote plasma source 840 with an RF power source can be found in the GAMMA®, manufactured by Lam Research Corporation of Fremont, Calif. Another example of an RF remote plasma source 840 can be found in the Astron®, manufactured by MKS Instruments of Wilmington, Mass., which can be operated at 440 kHz and can be provided as a subunit bolted onto a larger apparatus for processing one or more substrates in parallel. In some embodiments, a microwave plasma can be used with the remote plasma source 840, as found in the Astex®, also manufactured by MKS Instruments. A microwave plasma can be configured to operate at a frequency of 2.45 GHz.

In embodiments with an RF power source, the RF generator may be operated at any suitable power to form a plasma of a desired composition of radical species. Examples of suitable powers include, but are not limited to, powers between about 0.5 kW and about 6 kW. Likewise, the RF generator may provide RF power of a suitable frequency, such as 13.56 MHz for an inductively-coupled plasma.

Reducing gas species 820 are delivered from a gas inlet 842 and into an internal volume of the remote plasma source 840. The power supplied to the coils 844 can generate a remote plasma with the reducing gas species 820 to form radicals of the reducing gas species 820. The radicals formed in the remote plasma source 840 can be carried in the gas phase towards the substrate 810 through the showerhead 830. An example of a remote plasma source 855 with such a configuration can be described in U.S. Pat. No. 8,084,339, which is incorporated herein by reference in its entirety and for all purposes. The radicals of the reducing gas species 820 can reduce metal oxides on the surface of the substrate 810.

In addition to radicals of the reducing gas species, the remote plasma can also generate and include ions and other charged species of the reducing gas species 820. In some embodiments, the remote plasma may include neutral molecules of the reducing gas species 820. Some of the neutral molecules may be recombined molecules of charged species from the reducing gas species 820. The neutrals or recombined molecules of the reducing gas species 820 can also reduce metal oxides on the surface of the substrate 810, though they may take longer to react and reduce the metal oxides than the radicals of the reducing gas species 820. The ions may drift to the surface of the substrate 810 and reduce the metal oxides, or the ions may be accelerated toward the surface of the substrate 810 to reduce the metal oxides if the substrate support 805 has an oppositely charged bias. Having species with higher ion energies can allow deeper implantation into the metal seed layer to create metastable radical species further from the surface of the substrate 810. For example, if the substrate 810 has high aspect ratio features, such as between about 10:1 and about 60:1, ions with higher ionic energies may penetrate deeper into such features to provide reduction of the metal oxide more throughout the features. In contrast, some of the radicals of the reducing gas species 820 from remote plasma generation may recombine in the field or near the top of the features. The ions with higher ionic energies (such as 10 eV-100 eV) can also be used to re-sputter and reflow the metal in the metal seed layer, which can result in a more uniform seed coverage and reduce the aspect ratio for subsequent plating or metal deposition (such as PVD, CVD, ALD).

In FIG. 8, the remote plasma module 800 may actively cool or otherwise control the temperature of the substrate 810. In some embodiments, it may be desirable to control the temperature of the substrate 810 to control the rate of the reduction reaction and the uniformity of exposure to the remote plasma during processing. It may also be desirable to control the temperature of the substrate 810 to reduce the effects of oxidation on the substrate 810 before, during, and/or after processing.

In some embodiments, the remote plasma apparatus 800 can include movable members 815, such as lift pins, that are capable of moving the substrate 810 away from or towards the substrate support 805. The movable members 815 may contact the lower surface of the substrate 810 or otherwise pick up the substrate 810 from the substrate support 805. In some embodiments, the movable members 815 may move the substrate 810 vertically and control the spacing between the substrate 810 and the substrate support 805. In some embodiments, the movable members 815 can include two or more actuatable lift pins. The movable members 815 can be configured to extend between about 0 inches and about 5 inches, or more, away from the substrate support 805. The movable members 815 can extend the substrate 810 away from a hot substrate support 805 and towards a cool showerhead 830 to cool the substrate 810. The movable members 815 can also retract to bring the substrate 810 towards a hot substrate support 805 and away from a cool showerhead 830 to heat the substrate 810. By positioning the substrate 810 via the movable members 815, the temperature of the substrate 810 can be adjusted. When positioning the substrate 810, the showerhead 830 and the substrate support 805 can be held at a constant temperature.

In some embodiments, the remote plasma module 800 can include a showerhead 830 that allows for control of the showerhead temperature. An example of a showerhead configuration that permits temperature control can be described in U.S. Pat. No. 8,137,467, and U.S. Pat. No. 8,673,080, both of which are incorporated herein by reference in their entirety and for all purposes. Another example of a showerhead configuration that permits temperature control can be described in U.S. patent application Ser. No. 12/642,497, filed Dec. 18, 2009, and titled "TEMPERATURE CONTROLLED SHOWERHEAD FOR HIGH TEMPERATURE OPERATIONS," which is incorporated herein by reference in its entirety and for all purposes. To permit active cooling of the showerhead 830, a heat exchange fluid may be used, such as deionized water or a thermal transfer liquid manufactured by the Dow Chemical Company in Midland, Mich. In some embodiments, the heat exchange fluid may flow through fluid channels (not shown) in the showerhead 830. In addition, the showerhead 830 may use a heat exchanger system (not shown), such as a fluid heater/chiller to control temperature. In some embodiments, the temperature of the showerhead 830 may be controlled to below about 30° C., such as between about 5° C. and about 20° C. The showerhead 830 may be cooled to reduce damage to the metal seed layer that may result from excess heat during processing of the substrate 810. The showerhead 830 may also be cooled to lower the temperature of the substrate 810, such as before and after processing the substrate 810.

In some embodiments, the showerhead 830 may include a plurality of holes. Increasing the size and number of holes in the showerhead 830 and/or decreasing the thickness of the showerhead 830 may permit greater flow of radicals, ions, and UV radiation from the reducing gas species 820 through the showerhead 830. Exposing the metal seed layer to more radicals, ions, and UV radiation can provide more UV exposure and energetic species to reduce metal oxide in the metal seed layer. In some embodiments, the showerhead 830 can include between about 100 and about 900 holes. In some embodiments, an average diameter of the holes can be between about 0.05 and about 0.5 inches. This can result in an open area in the showerhead 830 due to holes of between about 3.7% and about 25%. In some embodiments, the showerhead 830 can have a thickness between about 0.25 and about 3.0 inches.

In some embodiments, the substrate support 805 may be configured to move to and away from the showerhead 830. The substrate support 805 may extend vertically to control the spacing between the substrate 810 and the showerhead 830. When reducing metal oxides on the substrate 810, the uniformity as well as the rate of the reduction on the substrate 810 may be tuned. For example, if the substrate support 805 is closer to the showerhead 830, reduction of the metal oxide on the surface of the substrate 810 may proceed faster. However, the center of the substrate 810 may get hotter than the edges of the substrate 810, which can result in a less uniform reduction treatment. Accordingly, the spacing between the substrate 810 and the showerhead 830 can be adjusted to obtain a desired rate and uniformity for processing the substrate 810. In some embodiments, the substrate support 805 can be configured to extend between about 0 inches and about 5 inches, or greater than about 5 inches, from the showerhead 830.

In some embodiments, the temperature of the substrate support 805 may also be adjusted. In some embodiments, the substrate support 805 can be a pedestal with one or more fluid channels (not shown). The fluid channels may circulate a heat transfer fluid within the pedestal to actively cool or actively heat the pedestal, depending on the temperature of the heat transfer fluid. Embodiments that include such fluid channels and heat transfer fluids can be described in actively cooled pedestal systems discussed earlier herein. The circulation of the heat transfer fluid through one or more fluid channels can control the temperature of the substrate support 805. Temperature control of the substrate support 805 can control the temperature of the substrate 810 to a finer degree. In some embodiments, the temperature of the substrate support 805 can be adjusted to be between about 0° C. and about 400° C.

In some embodiments, the remote plasma apparatus 800 can include one or more gas inlets 822 to flow cooling gas 860 through the processing chamber 850. The one or more gas inlets 822 may be positioned above, below, and/or to the side of the substrate 810. Some of the one or more gas inlets 822 may be configured to flow cooling gas 860 in a direction that is substantially perpendicular to the surface of the substrate 810. In some embodiments, at least one of the gas inlets 822 may deliver cooling gas 860 through the showerhead 830 to the substrate 810. Some of the one or more gas inlets 822 may be parallel to the plane of the substrate 810, and may be configured to deliver a cross-flow of cooling gas 860 across the surface of the substrate 810. In some embodiments, the one or more gas inlets 822 may deliver cooling gas 860 above and below the substrate 810. The flow of cooling gas 860 across the substrate 810 can enable rapid cooling of the substrate 810. Rapid cooling of the substrate 810 can reduce the oxidation of the metal seed layer in the substrate 810. Such cooling of the substrate 810 may take place before and after processing of the substrate 810. The flow rate of the cooling gas 860 for cooling can be between about 0.1 standard liters per minute (slm) and about 100 slm.

Examples of cooling gas 860 can include a relatively inert gas, such as nitrogen, helium, neon, krypton, xenon, radon, and argon. In some embodiments, the cooling gas 860 can include at least one of nitrogen, helium, and argon.

In some embodiments, the cooling gas 860 can be delivered at room temperature, such as between about 10° C. and about 30° C. In some embodiments, the cooling gas 860 can be delivered at a temperature less than room temperature. For example, a cold inert gas may be formed by expanding a cold liquid to gas, such as liquid argon, helium, or nitrogen. Thus, the temperature range of the cooling gas 860 used for cooling can be broadened to be anywhere between about −270° C. and about 30° C.

In some embodiments, the remote plasma apparatus 800 may be part of or integrated with an electroplating apparatus (not shown). This embodiment is more clearly depicted subsequent figures. Oxidation of the metal seed layer in the substrate 810 can occur rapidly during exposure to ambient conditions. By attaching or otherwise connecting the remote plasma module 800 to the electroplating apparatus, the duration of exposure to ambient conditions of the substrate 810 can be reduced. For example, the transfer time between the remote plasma module following treatment and the an electroplating module of the electroplating apparatus can be between about 15 seconds and about 90 seconds, or less than about 15 seconds.

Table I summarizes exemplary ranges of process parameters that can be used with certain embodiments of a remote plasma apparatus 800. These parameters may be used in any of the processes described above, as appropriate.

TABLE I

| Parameter | Parameter Range |
|---|---|
| Pedestal Temperature | 0° C.-400° C. |
| Showerhead Temperature | 5° C.-30° C. |
| Pedestal Dropping Vertical Travel | 0"-5" |
| Lift Pins Raising Vertical Travel | 0"-5" |
| Cooling Gas Flow ($N_2$/Ar/He - pure or mixture) | 0.1-100 slm |
| Cooling Gas Temperature | −270° C.-30° C. |
| Process Gas Flow | 0.5 slm-30 slm |
| Process Pressure | 0.5-6 Torr |
| Venting Gas Flow | Nominally same as cooling gas |
| Venting Gas | Nominally same as cooling gas |
| RF Plasma Power | 0.5-6 kW |
| Remote Plasma Apparatus to Electroplating Apparatus Transfer Time | 15-90 seconds |
| Showerhead hole number | 100-900 |
| Showerhead thickness | 0.25"-3.0" |
| Showerhead hole diameter | 0.05"-0.5" |
| Showerhead open area due to holes | 3.7%-25% |

A controller 835 may contain instructions for controlling parameters for the operation of the remote plasma apparatus 800. The controller 835 will typically include one or more memory devices and one or more processors. The processor may include a CPU or computer, analog and/or digital input/output connections, stepper motor controller boards, etc. Aspects of the controller 835 are further described below.

Figure 9A:
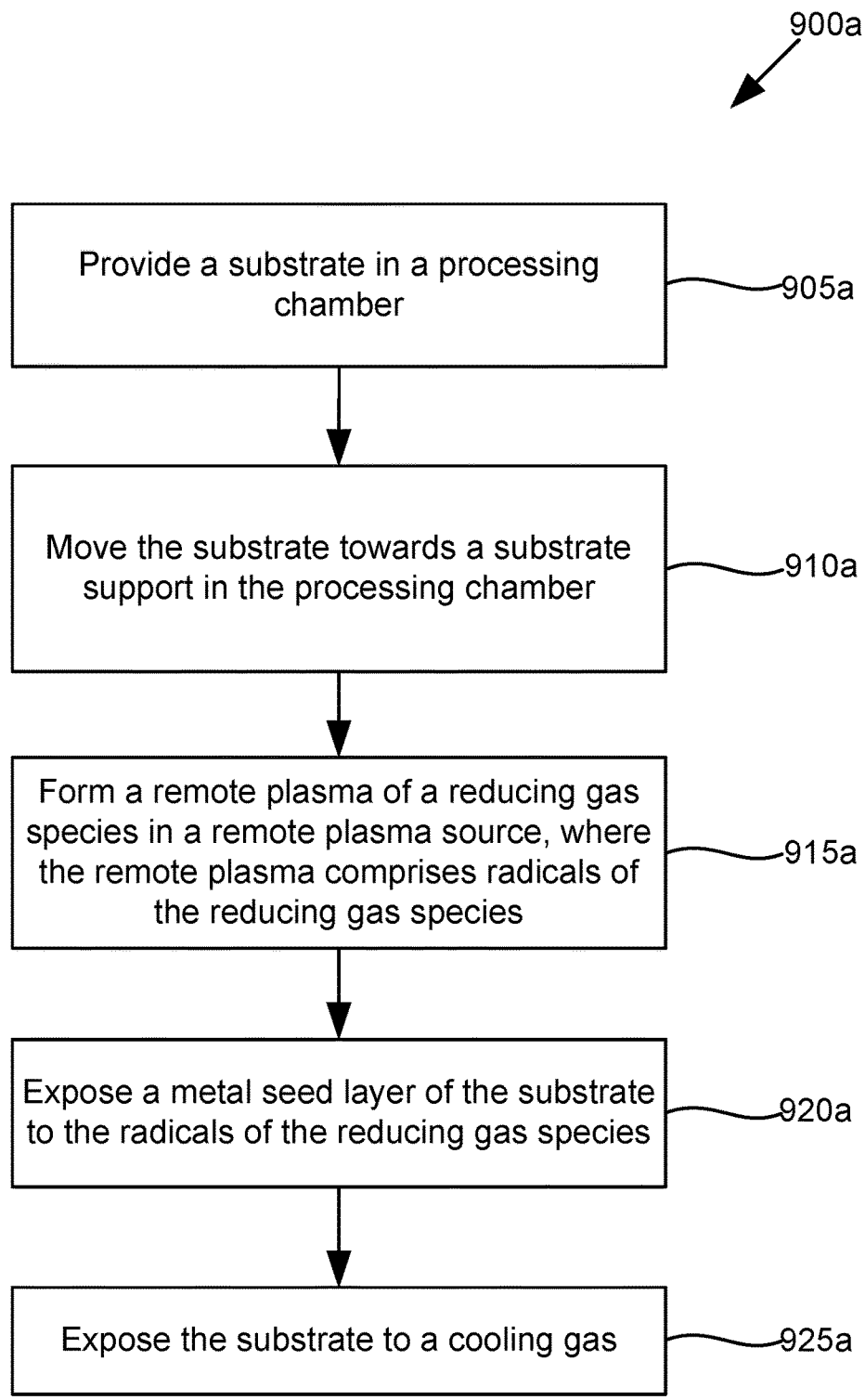
FIGS. 9A and 9B show flowcharts for methods of treating a substrate with a remote plasma treatment using a reducing plasma.

FIG. 9A shows an exemplary flow diagram illustrating a method of treating a substrate with a metal seed layer in a reducing plasma. FIGS. 10A-10D show examples of cross-sectional schematic diagrams illustrating various stages of treating a substrate with a metal seed layer using a remote plasma apparatus. Some of the steps discussed in FIG. 9A may be discussed with respect to a corresponding cross-sectional schematic diagram in FIGS. 10A-10D.

In FIG. 9A, the process 900a can begin with step 905a where a substrate is provided in a processing chamber. The substrate can include a metal seed layer, and a portion of this metal seed layer may be metal oxide. Prior to treatment of the substrate by a remote plasma, the substrate can be loaded into a processing chamber of a remote plasma module. In some embodiments, the substrate can be provided on one or more movable members in an actuated position. In some embodiments, inert gas may be flowed through the processing chamber to cool the substrate during loading. This can reduce additional oxidation of the substrate during loading. In some embodiments, upon loading the substrate into the processing chamber, the processing chamber can be closed and pumped down to vacuum or to a reduced pressure. This can provide an environment that is substantially free of oxygen. The pressure of the processing chamber can be between about 0.5 Torr and about 6 Torr, such as between about 0.5 Torr and 3 Torr. Reduced pressures can reduce the presence of oxygen in the environment. Thus, loading the substrate into the processing chamber in such conditions can reduce additional oxidation of the metal seed layer.

Figure 10A:
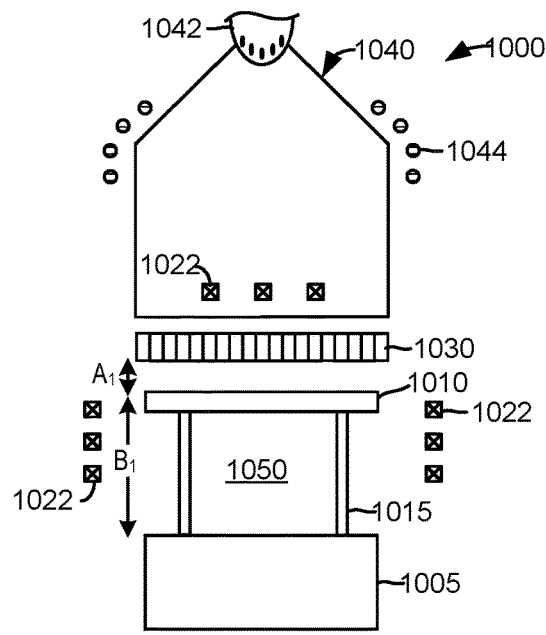
FIGS. 10A-10D illustrate a plasma treatment module at different times during a plasma treatment.

FIG. 10A shows an example of a cross-sectional schematic diagram of a remote plasma apparatus 1000 at one of the stages of treating a substrate with a metal seed layer (such as at step 905a). The remote plasma apparatus 1000 includes a substrate support 1005 in a processing chamber 1050, a remote plasma source 1040 over the substrate support 1005, and a showerhead 1030 between the remote plasma source 1040 and the substrate support 1005. Movable members 1015 may extend from the substrate support 1005 towards the showerhead 1030 to position the substrate 1010. Examples of movable members can include lift pins and peripheral grips. The substrate 1010 may include a metal seed layer, where the metal seed layer includes at least one of Cu, Co, Ru, Pd, Rh, Ir, Os, Ni, Au, Ag, Al, and W.

Figure 10B:
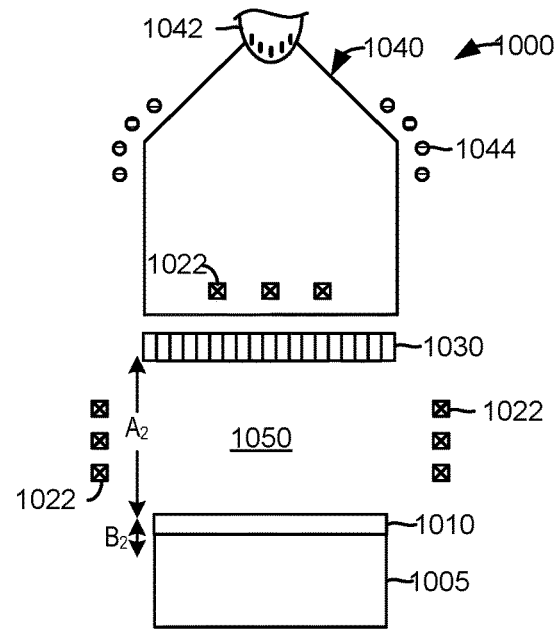

In FIG. 10A, the movable members 1015 in a processing chamber 1050 may position a substrate 1010 in an actuated position. The actuated position can place the substrate 1010 at a distance $A_1$ closer to the showerhead 1030 than an unactuated position (as illustrated in FIG. 10B). In the actuated position, the distance $A_1$ between the substrate 1010 and the showerhead 1030 can be between about 0.05 inches and about 0.75 inches. A distance $B_1$ between the substrate 1010 and the substrate support 1005 can be any desired distance. For example, the distance $B_1$ can be greater than about 1 inch, such as between about 1 inch and about 5 inches. The showerhead 1030 can be maintained at a relatively cool temperature, such as less than about 30° C.

Returning to FIG. 9A, at step 910a, the substrate is moved towards a substrate support in the processing chamber. In some embodiments, the substrate can be moved via the movable members to an unactuated position. The unactuated position is further from a showerhead in the processing chamber than the actuated position. In some embodiments, the substrate in the unactuated position may be in contact with the substrate support. For example, the movable members may be retracted so that the substrate can rest on the substrate support. In some embodiments, a gap can exist between the substrate support and the substrate, and heat transfer can occur via conduction, convection, radiation, or combinations thereof. The substrate support can be heated, which in turn can heat the substrate. The substrate support may be heated to a processing temperature, such as a temperature between about 0° C. and about 400° C. The temperature of the substrate support can depend on the metal seed layer of the substrate. For example, the substrate support can be heated between about 250° C. and about 300° C. for cobalt, and between about 75° C. and about 100° C. for copper. Higher temperatures of the substrate can speed up the metal oxide reduction reactions. However, the temperature may be selected to not exceed an agglomeration temperature of the metal seed layer. When the substrate is heated, the substrate may be exposed to a remote plasma treatment.

FIG. 10B shows an example of a cross-sectional schematic diagram of a remote plasma apparatus 1000 at one of the stages of treating a substrate with a metal seed layer (such as at step 910a). The remote plasma apparatus 1000 includes a substrate 1010 over the substrate support 1005, where the substrate 1010 is in the unactuated position. In the unactuated position, the substrate 1010 is positioned at a distance $A_2$ from the showerhead 1030 and is farther away from the showerhead 1030 than in the actuated position. The distance $A_2$ between the showerhead 1030 and the substrate 1010 can be greater than about 1 inch, such as between about 1 inch and about 5 inches. The substrate 1010 and the substrate support 1005 can be in contact with each other, or a distance $B_2$ between the substrate 1010 and the substrate support 1005 can be relatively small so as to allow efficient heat transfer between the substrate 1010 and the substrate support 1005. In some embodiments, the distance $B_2$ can be between about 0 inches and about 0.5 inches. In some embodiments, the movable members 1015 can be retracted so that the substrate 1010 rests on the substrate support 1005. The substrate support 1005 can position the substrate 1010 relative to the showerhead 1030 by vertically moving the substrate support 1010. The showerhead 1030 can be maintained at a relatively cool temperature, such as less than about 30° C.

The distance $A_2$ can be adjusted and can tune the rate of reaction and the uniformity of reaction during processing of the substrate. For example, where the substrate support 1005 is closer to the showerhead 1030, the rate of reduction may proceed faster but achieve less uniform results. The distance $A_2$ can be adjusted by vertical movement of the substrate support 1005. In some embodiments, the substrate support 1005 may move from a first position to a second position in the processing chamber, where a distance between the first position and the second position is greater than about 1 inch. An increased degree of freedom for positioning the substrate support 1005 provides greater flexibility in tuning the rate and uniformity of the subsequent reduction treatment.

Returning to FIG. 9A, at step 915a, a remote plasma can be formed of a reducing gas species in a remote plasma source, where the remote plasma includes radicals of the reducing gas species. The remote plasma can be formed by exposing the reducing gas species to a source of energy. The energy source can produce radicals, ions, and other charged species that can be flowed towards the substrate. In some embodiments, the energy source can be an RF discharge. When the remote plasma is formed, the substrate can be or is already heated to a desired processing temperature. In some embodiments, a showerhead is connected to the remote plasma source and filters out the ions so that the radicals of the reducing gas species can be flowed towards the substrate in the processing chamber.

At step 920a, the metal seed layer of the substrate is exposed to the radicals of the reducing gas species. A portion of the metal seed layer can include an oxide of the metal seed layer. Ions, radicals, and other charged species formed in the remote plasma flow through the showerhead, and ions and other charged species can be filtered out so that the substrate is substantially exposed to radicals of the reducing gas species. The metal oxide (or photoresist scum) can react with the radicals of the reducing gas species or the reducing gas species itself to convert the metal oxide to metal (or clean away the scum). The reaction takes place under conditions that convert the metal oxide to metal. The metal oxide in the metal seed layer is reduced to form a film integrated with the metal seed layer. Reduction of a metal oxide in a metal seed layer using a reducing gas species is further described in U.S. application Ser. No. 13/787,499, filed Mar. 6, 2013, and titled "METHODS FOR REDUCING METAL OXIDE SURFACES TO MODIFIED METAL SURFACES USING A GASEOUS REDUCING ENVIRONMENT," and U.S. patent application Ser. No. 14/086,770, filed Nov. 21, 2013, and titled "METHOD AND APPARATUS FOR REMOTE PLASMA TREATMENT FOR REDUCING METAL OXIDES ON A METAL SEED LAYER," each of which is incorporated herein by reference in its entirety and for all purposes. In some embodiments, radicals of the reducing gas species flow through the showerhead when the showerhead is maintained at a temperature below about 30° C.

Figure 10C:
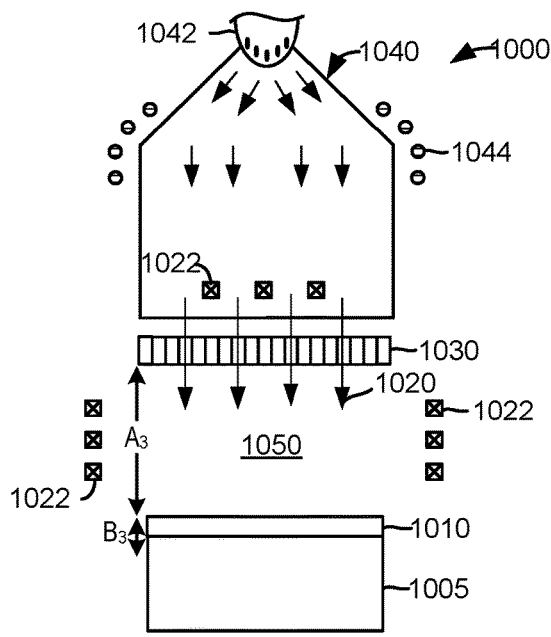

FIG. 10C shows an example of a cross-sectional schematic diagram of a remote plasma apparatus 1000 at one of the stages of treating a substrate with a metal seed layer (such as at steps 915a and 920a). The remote plasma apparatus 1000 includes a remote plasma source 1040 over the substrate 1010 and one or more coils 1044 surrounding the walls of the remote plasma source 1040. A gas inlet 1042 can be connected to the remote plasma source 1040 to deliver a reducing gas species 1020 into an internal volume of the remote plasma source 1040. The reducing gas species 1020 can be flowed at a flow rate between about 500 sccm and about 30,000 sccm, which can be applicable to any substrate size. In some embodiments, the reducing gas species 1020 can include at least one of $H_2$, $NH_3$, CO, $B_2H_6$, sulfite compounds, carbon and/or hydrocarbons, phosphites, and $N_2H_4$. Power supplied to the one or more coils 1044 can generate a remote plasma of the reducing gas species 1020 in the remote plasma source 1040. RF plasma power supplied to the coils 1044 can be between about 0.5 kW and about 6 kW. The remote plasma can include radicals of the reducing gas species 1020, such as H*, NH*, $NH_2$*, or $N_2H_3$*. The remote plasma can also include ions and other charged species, but the showerhead 1030 can filter them out so that the radicals of the reducing gas species 1020 arrive at the substrate 1010. The radicals of the reducing gas species 1020 flow from the remote plasma source 1040 through the showerhead 1030 and onto the surface of the substrate 1010 in the processing chamber 1050. The showerhead 1030 can be maintained at a relatively cool temperature, such as less than about 30° C. The cooled showerhead 1030 can limit excess heat from reaching the substrate 1010 and avoid damaging the metal seed layer in the substrate 1010.

In FIG. 10C, the substrate 1010 can remain in an unactuated position. A distance $A_3$ between the substrate 1010 and the showerhead 1030 can be adjusted by moving the substrate support 1005. Adjusting the distance $A_3$ can tune the rate of reduction reaction and the uniformity of the reduction reaction occurring at the substrate 1010. For example, a shorter distance $A_3$ can lead to faster conversion of metal oxide but less uniformity, while a longer distance $A_3$ can lead to slower conversion of metal oxide but greater uniformity. In some embodiments, the distance $A_3$ can be the same as the distance $A_2$. Movable members 1015 can be retracted so that the substrate 1010 and the substrate support 1005 remain in contact, or a distance $B_3$ between the substrate 1010 and the substrate support 1005 can be the same as the distance $B_2$ in FIG. 10B.

The temperature of the substrate support 1005 can be adjusted via an active heating or active cooling system. The temperature can be tuned according to the metal seed layer in the substrate 1010 being treated. For example, the temperature of the substrate support 1005 can be changed when switching between two different metal seed layers that require operating in two different temperature regimes. For example, the substrate support 1005 can be heated between about 250° C. and about 300° C. for a cobalt seed layer, and switched to be between about 75° C. and about 100° C. for a copper seed layer.

Returning to FIG. 9A, at step 925a, the substrate is exposed to a cooling gas. The cooling gas can include at least one of argon, helium, and nitrogen. In some embodiments, the cooling gas can be produced by expanding a cold liquid to a gas. Exposing the substrate to the cooling gas can cool the substrate to a temperature below about 30° C. Thus, the cooling gas can be delivered at a temperature below ambient conditions to cool the substrate. In some embodiments, the substrate can be moved to an actuated position via the movable members prior to exposing the substrate to the cooling gas. The substrate can be exposed to the cooling gas while in the actuated position for faster cooling. In some embodiments, the substrate can be transferred to an electroplating module of an electroplating apparatus after exposing the substrate to the cooling gas. Alternatively, the substrate may be transferred to an electroless plating or other metal deposition apparatus. In some embodiments, the processing chamber can be vented to atmospheric conditions with a venting gas after exposing the substrate to the cooling gas.

Figure 10D:
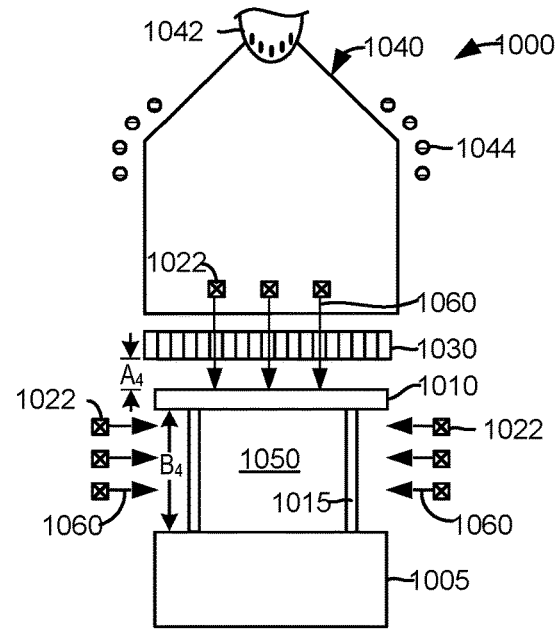

FIG. 10D shows an example of a cross-sectional schematic diagram of a remote plasma apparatus 1000 at one of the stages of treating a substrate with a metal seed layer (such as at step 925a). The remote plasma apparatus 1000 can include one or more cooling gas inlets 1022 for delivering a cooling gas 1060. The cooling gas inlets 1022 may be positioned around the substrate 1010, including above and to the side of the substrate 1010. Cooling gas 1060 can be directed onto the substrate 1010 through the showerhead 1030 and perpendicular to the substrate plane. Cooling gas 1060 can also be directed onto the substrate 1010 and parallel to the substrate plane from cooling gas inlets 1022 on the sides of the process chamber 1050. The cooling gas 1060 can be flowed into the process chamber 1050 at a flow rate between about 0.1 slm and about 100 slm. The cooling gas inlets 1022 can flush cooling gas 1060 across the substrate 1010 to rapidly cool the substrate 1010 prior to transferring the substrate to an electroplating, electroless plating, or other metal deposition apparatus. In some embodiments, the substrate 1010 can be cooled without turning off or cooling the substrate support 1005. This can enable the substrate 1010 to be treated and cooled within a single process chamber 1050 without having to use a two-chamber design having separate heating and cooling zones.

In FIG. 10D, the substrate 1010 can be in an actuated position. A distance $A_4$ between the showerhead 1030 and the substrate 1010 can be between about 0.05 inches and about 0.75 inches. In some embodiments, the distance $A_4$ can be the same as the distance $A_1$ in FIG. 10A. By positioning the substrate 1010 closer to a cooled showerhead 1030 and away from a hot substrate support 1005, the substrate 1010 can be cooled at a faster rate. Movable members 1015 can lift the substrate 1010 away from the substrate support 1005 and towards the showerhead 1030. A distance $B_4$ between the substrate support 1005 and the substrate 1010 can be greater than about 1 inch, or between about 1 inch and about 5 inches. In some embodiments, the distance $B_4$ can be the same as the distance $B_1$ in FIG. 10A. In some embodiments, when the substrate 1010 is in the actuated position and cooled to about room temperature, the process chamber 1050 can be vented to atmospheric conditions and transferred to an electroplating, electroless plating, or other metal deposition module in a deposition apparatus.

Figure 9B:
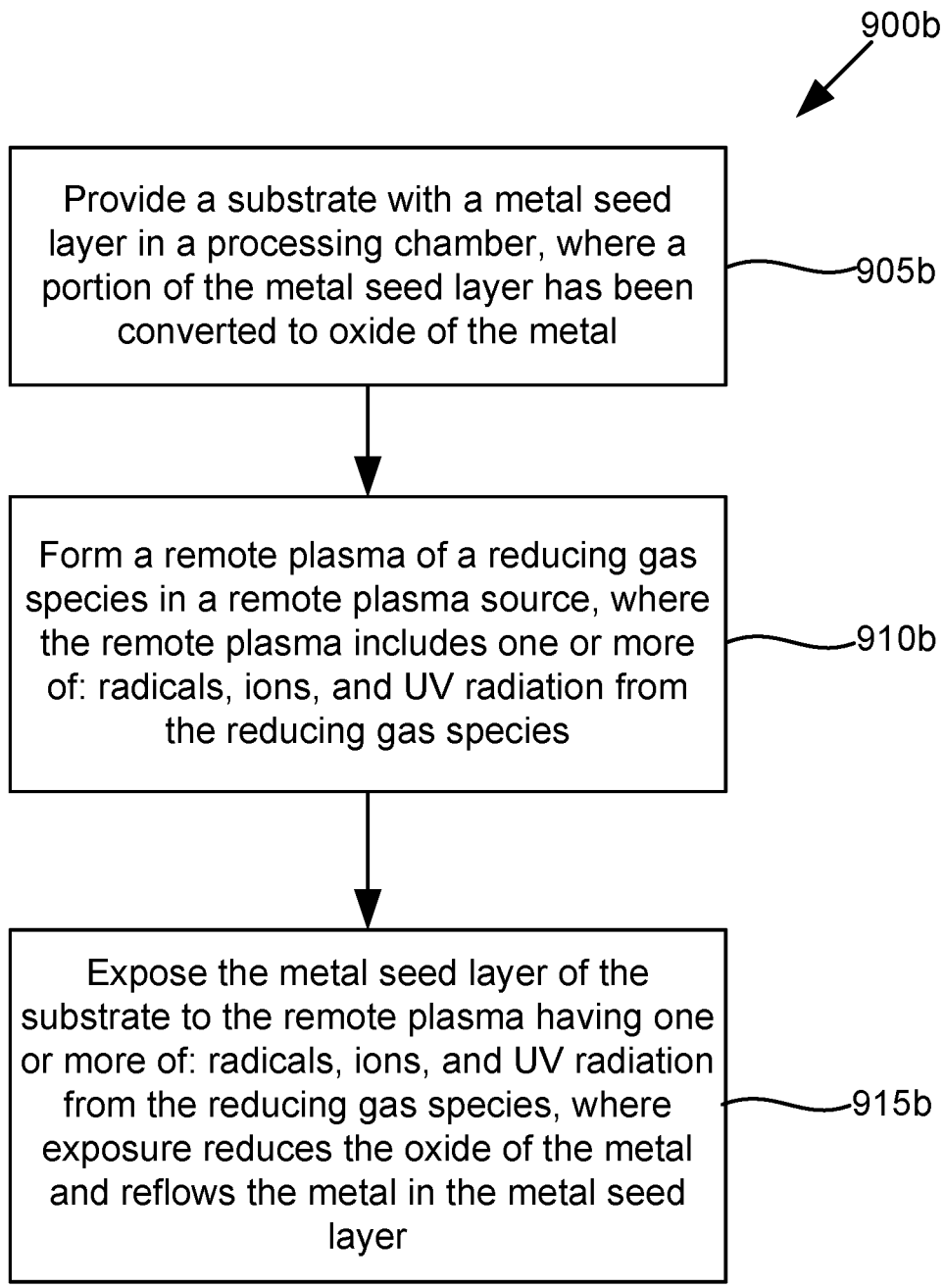

FIG. 9B shows an exemplary flow diagram illustrating another method of treating a substrate with a metal seed layer. At step 905b of the method 900b, a substrate with a metal seed layer can be provided in a processing chamber, as generally described at step 905a of the method 900a. The metal seed layer can have a portion that has been converted to oxide of the metal.

At step 910b, a remote plasma of a reducing gas species can be formed in a remote plasma source, where the remote plasma includes one or more of: radicals, ions, and UV radiation from the reducing gas species. The energy of the remote plasma may be increased to generate higher energy species, including higher energy ions. Higher energy ions may be produced in high density plasma (HDP) processing systems and/or sputtering systems. The remote plasma may also generate UV radiation as a result of excitation of the reducing gas species. The generated UV radiation can have a wavelength between about 100 nm and about 700 nm. For example, the generated UV radiation can include short wavelength UV light, such as between about 120 nm and about 200 nm, and long wavelength UV light, such as between about 200 nm and about 700 nm. In addition, the remote plasma may include neutrals and/or generate recombined molecules of the reducing gas species.

At step 915b, the metal seed layer of the substrate is exposed to the remote plasma, where the exposure reduces the oxide of the metal, removes photoresist scum, and reflows the metal in the metal seed layer. In some implementations, reflow of the metal and the reduction of the metal oxide may occur concurrently. In some implementations, the remote plasma can include radicals, ions, and UV radiation from the reducing gas species, or some combination thereof. A showerhead between the remote plasma source and the processing chamber can have a thickness, a number of holes, and an average diameter of holes configured to permit radicals, ions, and UV radiation flow or otherwise travel through the showerhead toward the substrate. The radicals, ions, and UV radiation may enter the processing chamber and reduce metal oxide in the metal seed layer. High energy ions may penetrate further from the surface of the substrate to provide a reducing chemistry throughout more of the metal seed layer. UV radiation may activate the metal oxide surface to improve the thermodynamics of the reduction process, or directly reduce the metal oxide itself. The UV radiation may also be absorbed by the reducing gas species and give rise to radicals that can reduce metal oxide. Furthermore, neutral molecules of the reducing gas species may further react and reduce metal oxide in the metal seed layer.

In some implementations, the metal in the metal seed layer may be excited and mobilized upon exposure. The metal may be reflowed to reduce gaps and voids in the metal seed layer, which can reduce the surface roughness of the metal seed layer. How much the metal is reflowed can depend on the temperature of the substrate, the chamber pressure, the reducing gas species, and the intensity of the UV radiation, for example. As the metal is reflowed and redistributed on the underlying layer, a more uniform and continuous metal seed layer can be formed.

Figure 11A:
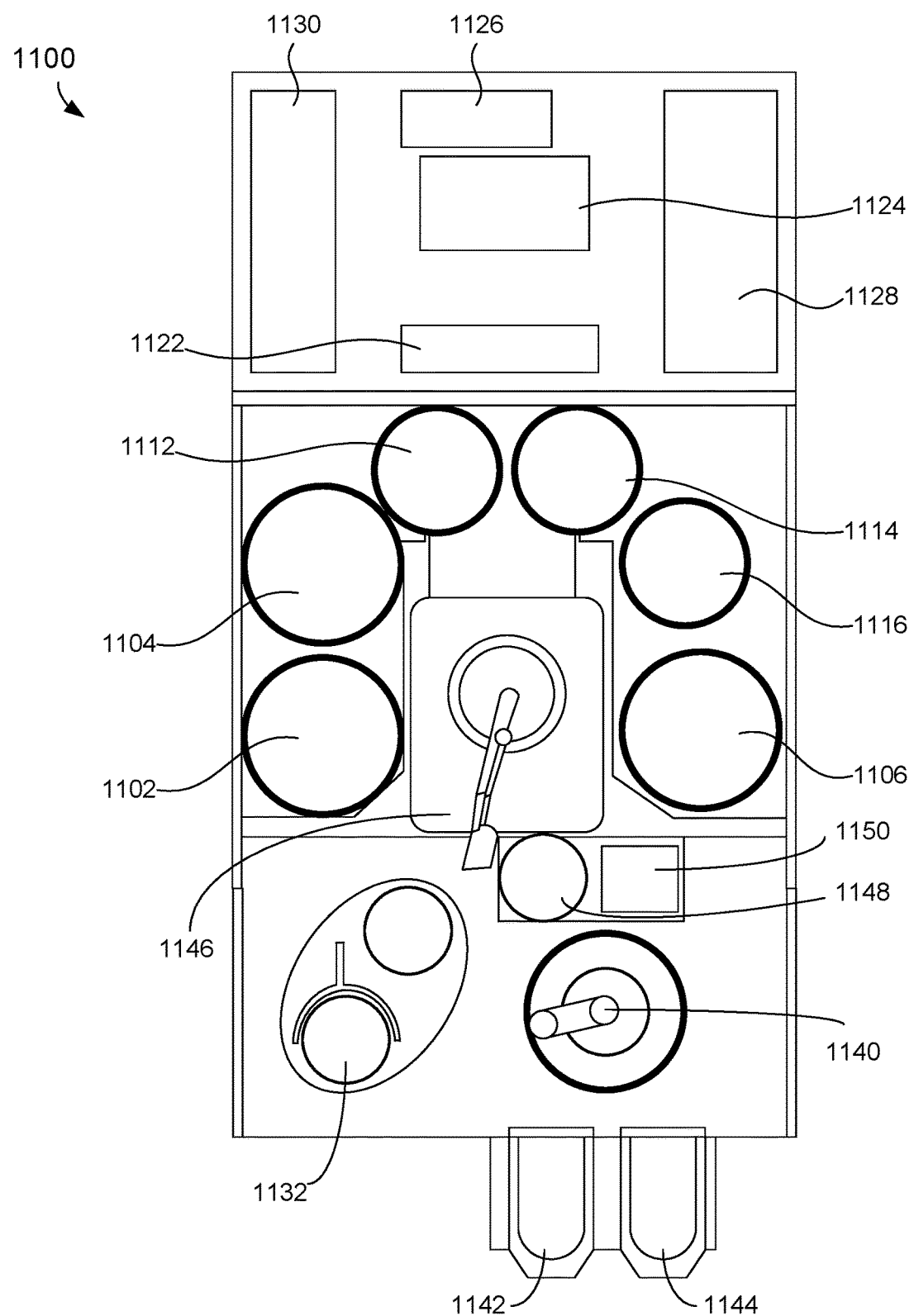
FIG. 11A depicts a multi-tool electroplating apparatus.

FIG. 11A shows an example of a top view schematic of an electroplating apparatus. The electroplating apparatus 1100 can include three separate electroplating modules 1102, 1104, and 1106. The electroplating apparatus 1100 can also include three separate modules 1112, 1114, and 1116 configured for various process operations. For example, in some embodiments, modules 1112 and 1116 may be spin rinse drying (SRD) modules and module 1114 may be an annealing station. In some embodiments, at least one of the modules 1112, 1114, and 1116 may be post-electrofill modules (PEMs), each configured to perform a function, such as edge bevel removal, backside etching, and acid cleaning of substrates after they have been processed by one of the electroplating modules 1102, 1104, and 1106.

The electroplating apparatus 1100 can include a central electroplating chamber 1124. The central electroplating chamber 1124 is a chamber that holds the chemical solution used as the electroplating solution in the electroplating modules 1102, 1104, and 1106. The electroplating apparatus 1100 also includes a dosing system 1126 that may store and deliver additives for the electroplating solution. A chemical dilution module 1122 may store and mix chemicals that may be used as an etchant. A filtration and pumping unit 1128 may filter the electroplating solution for the central electroplating chamber 1124 and pump it to the electroplating modules 1102, 1104, and 1106.

In some embodiments, an annealing station 1132 may be used to anneal substrates as pretreatment. The annealing station 1132 may include a number of stacked annealing devices, e.g., five stacked annealing devices. The annealing devices may be arranged in the annealing station 1132 one on top of another, in separate stacks, or in other multiple device configurations.

A system controller 1130 provides electronic and interface controls required to operate the electroplating apparatus 1100. The system controller 1130 (which may include one or more physical or logical controllers) controls some or all of the properties of the electroplating apparatus 1100. The system controller 1130 typically includes one or more memory devices and one or more processors. The processor may include a central processing unit (CPU) or computer, analog and/or digital input/output connections, stepper motor controller boards, and other like components. Instructions for implementing appropriate control operations as described herein may be executed on the processor. These instructions may be stored on the memory devices associated with the system controller 1130 or they may be provided over a network. In certain embodiments, the system controller 1130 executes system control software.

The system control software in the electroplating apparatus 1100 may include electroplating instructions for controlling the timing, mixture of the electrolyte components, inlet pressure, plating cell pressure, plating cell temperature, substrate temperature, current and potential applied to the substrate and any other electrodes, substrate position, substrate rotation, and other parameters performed by the electroplating apparatus 1100. System control software may be configured in any suitable way. For example, various process tool component sub-routines or control objects may be written to control operation of the process tool components necessary to carry out various process tool processes. System control software may be coded in any suitable computer readable programming language.

In some embodiments, system control software includes input/output control (IOC) sequencing instructions for controlling the various parameters described above. For example, each phase of an electroplating process may include one or more instructions for execution by the system controller 1130, and each phase of the pretreatment or reducing process may include one or more instructions for execution by the system controller 1130. In electroplating, the instructions for setting process conditions for an immersion process phase may be included in a corresponding immersion recipe phase. In pretreatment or reducing, the instructions for setting process conditions for exposing the substrate to a remote plasma may be included in a corresponding reducing phase recipe. In some embodiments, the phases of electroplating and reducing processes may be sequentially arranged, so that all instructions for a process phase are executed concurrently with that process phase.

Other computer software and/or programs may be employed in some embodiments. Examples of programs or sections of programs for this purpose include a substrate positioning program, an electrolyte composition control program, a pressure control program, a heater control program, a potential/current power supply control program. Other examples of programs or sections of this program for this purpose include a timing control program, movable members positioning program, a substrate support positioning program, a remote plasma apparatus control program, a pressure control program, a substrate support temperature control program, a showerhead temperature control program, a cooling gas control program, and a gas atmosphere control program.

In some embodiments, there may be a user interface associated with the system controller 1130. The user interface may include a display screen, graphical software displays of the apparatus and/or process conditions, and user input devices such as pointing devices, keyboards, touch screens, microphones, etc.

Signals for monitoring the process may be provided by analog and/or digital input connections of the system controller 1130 from various process tool sensors. The signals for controlling the process may be output on the analog and digital output connections of the process tool. Non-limiting examples of process tool sensors that may be monitored include mass flow controllers, pressure sensors (such as manometers), thermocouples, etc. Appropriately programmed feedback and control algorithms may be used with data from these sensors to maintain process conditions, such as temperature of the substrate.

A hand-off tool 1140 may select a substrate from a substrate cassette such as the cassette 1142 or the cassette 1144. The cassettes 1142 or 1144 may be front opening unified pods (FOUPs). A FOUP is an enclosure designed to hold substrates securely and safely in a controlled environment and to allow the substrates to be removed for processing or measurement by tools equipped with appropriate load ports and robotic handling systems. The hand-off tool 1140 may hold the substrate using a vacuum attachment or some other attaching mechanism.

The hand-off tool 1140 may interface with the annealing station 1132, the cassettes 1142 or 1144, a transfer station 1150, or an aligner 1148. From the transfer station 1150, a hand-off tool 1146 may gain access to the substrate. The transfer station 1150 may be a slot or a position from and to which hand-off tools 1140 and 1146 may pass substrates without going through the aligner 1148. In some embodiments, however, to ensure that a substrate is properly aligned on the hand-off tool 1146 for precision delivery to an electroplating module, the hand-off tool 1146 may align the substrate with an aligner 1148. The hand-off tool 1146 may also deliver a substrate to one of the electroplating modules 1102, 1104, or 1106 or to one of the three separate modules 1112, 1114, and 1116 configured for various process operations.

Figure 11B:
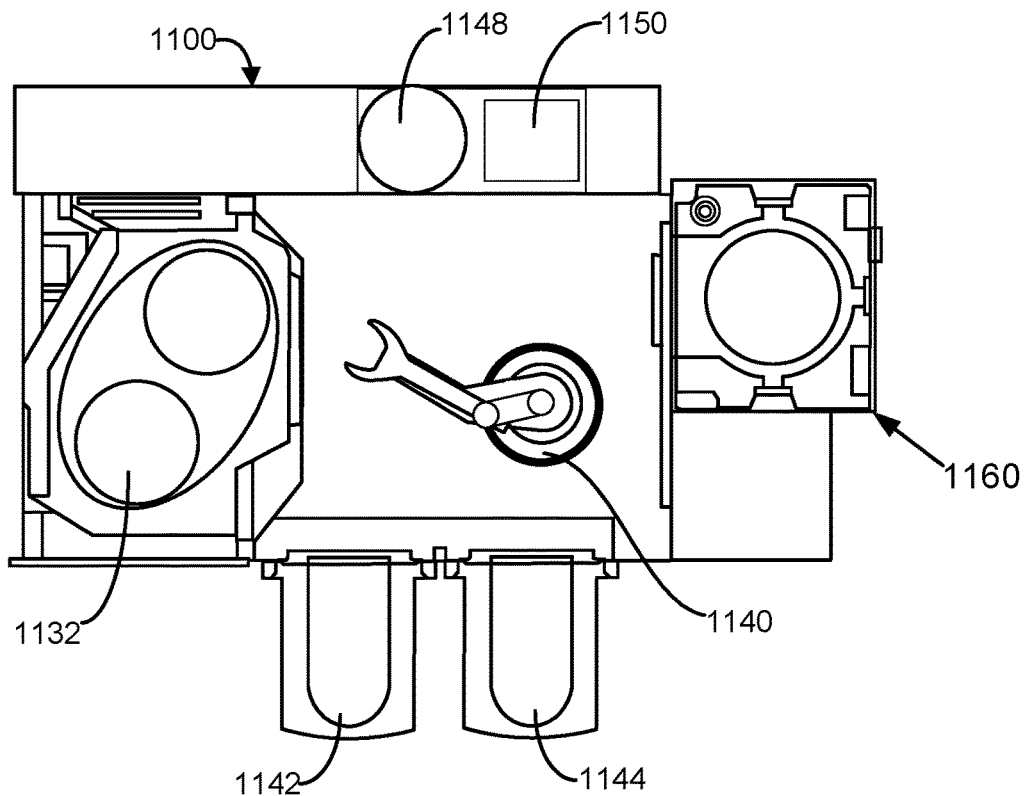
FIGS. 11B and 11C further illustrate embodiments where a multi-tool electroplating apparatus includes a remote plasma treatment module.
Figure 11C:
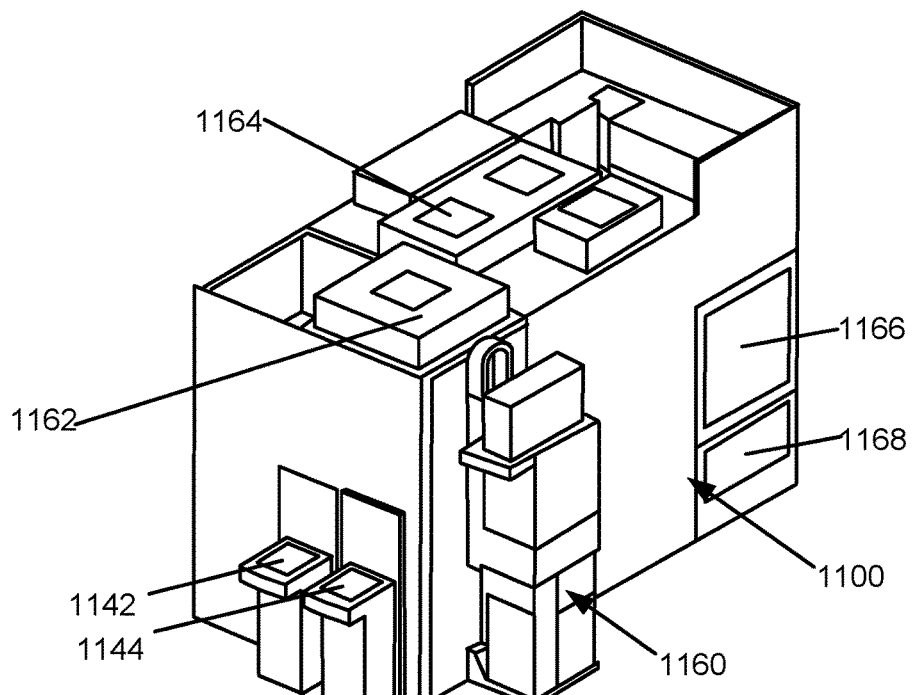

In some embodiments, a remote plasma apparatus may be part of or integrated with the electroplating apparatus 1100. FIG. 11B shows an example of a magnified top view schematic of a remote plasma apparatus with an electroplating apparatus. However, it is understood by those of ordinary skill in the art that the remote plasma apparatus may alternatively be attached to an electroless plating apparatus or other metal deposition apparatus. FIG. 11C shows an example of a three-dimensional perspective view of a remote plasma apparatus attached to an electroplating apparatus. The remote plasma apparatus 1160 may be attached to the side of the electroplating apparatus 1100. The remote plasma apparatus 1160 may be connected to the electroplating apparatus 1100 in such a way so as to facilitate efficient transfer of the substrate to and from the remote plasma apparatus 1160 and the electroplating apparatus 1100. The hand-off 1140 may gain access to the substrate from cassette 1142 or 1144. The hand-off tool 1140 may pass the substrate to the remote plasma apparatus 1160 for exposing the substrate to a remote plasma treatment and a cooling operation. The hand-off tool 1140 may pass the substrate from the remote plasma apparatus 1160 to the transfer station 1150. In some embodiments, the aligner 1148 may align the substrate prior to transfer to one of the electroplating modules 1102, 1104, and 1106 or one of the three separate modules 1112, 1114, and 1116.

Operations performed in the electroplating apparatus 1100 may introduce exhaust that can flow through front-end exhaust 1162 or a back-end exhaust 1164. The electroplating apparatus 1100 may also include a bath filter assembly 1166 for the central electroplating station 1124, and a bath and cell pumping unit 1168 for the electroplating modules 1102, 1104, and 1106.

In some embodiments, the system controller 1130 may control the parameters for the process conditions in the remote plasma apparatus 1160. Non-limiting examples of such parameters include substrate support temperature, showerhead temperature, substrate support position, movable members position, cooling gas flow, cooling gas temperature, process gas flow, process gas pressure, venting gas flow, venting gas, reducing gas, plasma power, and exposure time, transfer time, etc. These parameters may be provided in the form of a recipe, which may be entered utilizing the user interface as described earlier herein.

Operations in the remote plasma apparatus 1160 that is part of the electroplating apparatus 1100 may be controlled by a computer system. In some embodiments, the computer system is part of the system controller 1130 as illustrated in FIG. 11A. In some embodiments, the computer system may include a separate system controller (not shown) including program instructions. The program instructions may include instructions to perform all of the operations needed to reduce metal oxides to metal in a metal seed layer. The program instructions may also include instructions to perform all of the operations needed to cool the substrate, position the substrate, and load/unload the substrate.

In some embodiments, a system controller may be connected to a remote plasma apparatus 1160 in a manner as illustrated in FIG. 8. In one embodiment, the system controller includes instructions for providing a substrate in a processing chamber, moving the substrate towards a substrate support in the processing chamber, forming a remote plasma of a reducing gas species in a remote plasma source, where the remote plasma includes radicals of the reducing gas species, exposing a metal seed layer of the substrate to radicals of the reducing gas species, and exposing the substrate to a cooling gas. The remote plasma may include one or more of radicals, ions, neutrals, and UV radiation from the reducing gas species, resulting in the metal seed layer being exposed to one or more of radicals, ions, neutrals, and UV radiation from the reducing gas species. The system controller may further include instructions for performing operations as described earlier herein with respect to FIGS. 8, 9A, 9B, and 10A-10D.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

What is claimed is:

1. A method of removing photoresist scum and electroplating metal into photoresist features, the method comprising:
   (a) receiving a substrate in a multi-tool electroplating apparatus, the multi-tool electroplating apparatus comprising:
      (i) at least one plasma treatment module comprising a plasma treatment chamber and a plasma generation chamber connected to the plasma treatment chamber; and
      (ii) at least one electroplating module comprising an electroplating chamber;
      wherein the substrate comprises:
      (i) a metal seed layer, and
      (ii) a layer of photoresist over and directly in contact with the metal seed layer, wherein the layer of photoresist comprises photoresist features patterned therein, and wherein a bottom of the photoresist features comprise photoresist scum;
   (b) generating a reducing plasma from a reducing plasma generation gas in the plasma generation chamber;
   (c) flowing the reducing plasma from the plasma generation chamber into the plasma treatment chamber to thereby expose the substrate to the reducing plasma, react the photoresist scum with the reducing plasma, and remove at least a portion of the photoresist scum; and
   (d) transferring the substrate to the electroplating module and electroplating metal on the metal seed layer in the photoresist features.

2. The method of claim 1, wherein the reducing plasma generation gas comprises one or more of hydrogen, ammonia, nitrogen, carbon monoxide, diborane, sulfite compounds, hydrocarbons, phosphites, and/or hydrazine.

3. The method of claim 1, wherein the reducing plasma generation gas comprises hydrogen.

4. The method of claim 1, further comprising:
   (e) after electroplating in (d), transferring the substrate to the plasma treatment chamber, generating a stripping plasma in the plasma generation chamber from a stripping plasma generation gas, flowing the stripping plasma from the plasma generation chamber into the plasma treatment chamber, exposing the substrate to the stripping plasma, and thereby reacting the stripping plasma with the layer of photoresist to strip the layer of photoresist from the substrate.

5. The method of claim 4, wherein the stripping plasma generation gas comprises oxygen and/or $CO_2$.

6. The method of claim 4, wherein operation (e) forms oxidized portions of the metal seed layer, and further comprising:
   (f) after stripping the layer of photoresist in (e), generating a second reducing plasma in the plasma generation chamber from a second reducing plasma generation gas, flowing the second reducing plasma from the plasma generation chamber into the plasma treatment chamber, exposing the substrate to the second reducing plasma, and thereby reacting the oxidized portions of the metal seed layer with the second reducing plasma to reduce the oxidized portions of the metal seed layer.

7. The method of claim 6, wherein the second reducing plasma generation gas comprises one or more of hydrogen, ammonia, nitrogen, carbon monoxide, diborane, sulfite compounds, hydrocarbons, phosphites, and/or hydrazine.

8. The method of claim 1, wherein the reducing plasma is substantially free of oxidizing species.

9. The method of claim 8, wherein the layer of photoresist is not exposed to an oxidizing plasma between the time it is developed and the time at which operations (b)-(c) occur.

10. A multi-tool electroplating apparatus for removing photoresist scum and electroplating metal in features on a semiconductor substrate having a metal seed layer under an exposed layer of patterned photoresist, comprising:
   (i) a plasma treatment module comprising a plasma treatment chamber connected with a plasma generation chamber;
   (ii) an electroplating module comprising an electroplating chamber;
   (iii) a transfer mechanism for transferring the substrate between the plasma treatment module and the electroplating module; and
   (iv) a controller having instructions to:
      (a) transfer the substrate into the plasma treatment chamber of the plasma treatment module;
      (b) generate a reducing plasma in the plasma generation chamber from a reducing plasma generation gas, and flow the reducing plasma from the plasma generation chamber into the plasma treatment chamber to thereby expose the substrate to the reducing plasma and react the photoresist scum with the reducing plasma to remove at least a portion of the photoresist scum;
      (c) transfer the substrate from the plasma treatment chamber to the electroplating chamber via the transfer mechanism; and
      (d) electroplate metal on the metal seed layer in the features in the patterned photoresist.

11. The apparatus of claim 10, the controller further having instructions to:
   (e) after electroplating in (d), transfer the substrate from the electroplating chamber to the plasma treatment chamber via the transfer mechanism;
   (f) generate a stripping plasma in the plasma generation chamber from a stripping plasma generation gas, and flow the stripping plasma from the plasma generation chamber into the plasma treatment chamber to thereby expose the substrate to the stripping plasma and react the stripping plasma with the layer of patterned photoresist to strip the patterned photoresist from the substrate.

12. The apparatus of claim 11, the controller further having instructions to:

(g) after stripping photoresist in (f), generate a second reducing plasma in the plasma generation chamber from a second reducing plasma generation gas, and flow the second reducing plasma from the plasma generation chamber into the plasma treatment chamber to thereby expose the substrate to the second reducing plasma and react the second reducing plasma with oxidized portions of the metal seed layer to thereby reduce the oxidized portions of the metal seed layer.

13. A multi-tool electroplating apparatus for removing photoresist scum and electroplating metal in features on a semiconductor substrate having a metal seed layer under an exposed layer of patterned photoresist, comprising:
(i) a plasma treatment module comprising a plasma treatment chamber connected with a plasma generation chamber;
(ii) an electroplating module comprising an electroplating chamber;
(iii) a transfer mechanism for transferring the substrate between the plasma treatment module and the electroplating module; and
(iv) a controller having instructions to:
 (a) transfer the substrate into the plasma treatment chamber of the plasma treatment module;
 (b) generate a first oxidizing plasma in the plasma generation chamber from a first oxidizing plasma generation gas, and flow the first oxidizing plasma from the plasma generation chamber into the plasma treatment chamber to thereby expose the substrate to the first oxidizing plasma and react the first oxidizing plasma with the photoresist scum to remove at least a portion of the photoresist scum and form oxidized portions of the metal seed layer;
 (c) generate a reducing plasma in the plasma generation chamber from a reducing plasma generation gas, and flow the reducing plasma from the plasma generation chamber into the plasma treatment chamber to thereby expose the substrate to the reducing plasma and react the oxidized portions of the metal seed layer with the reducing plasma to reduce the oxidized portions of the metal seed layer;
 (d) transfer the substrate from the plasma treatment chamber to the electroplating chamber via the transfer mechanism; and
 (e) electroplate metal on the metal seed layer in the features in the patterned photoresist.

14. The apparatus of claim 13, the controller further having instructions to:
 (f) after electroplating in (e), transfer the substrate from the electroplating chamber to the plasma treatment chamber via the transfer mechanism;
 (g) generate a stripping plasma in the plasma generation chamber from a stripping plasma generation gas, and flow the stripping plasma from the plasma generation chamber into the plasma treatment chamber to thereby expose the substrate to the stripping plasma and react the stripping plasma with the layer of patterned photoresist to strip the patterned photoresist from the substrate.

15. The apparatus of claim 14, wherein operation (g) results in formation of oxidized portions of the metal seed layer, the controller further having instructions to:
 (h) after stripping photoresist in (g), generate a second reducing plasma in the plasma generation chamber from a second reducing plasma generation gas, and flow the second reducing plasma from the plasma generation chamber into the plasma treatment chamber to thereby expose the substrate to the second reducing plasma and react the second reducing plasma with the oxidized portions of the metal seed layer to reduce the oxidized portions of the metal seed layer.

* * * * *